(12) United States Patent
Yang et al.

(10) Patent No.: US 9,245,971 B2
(45) Date of Patent: Jan. 26, 2016

(54) SEMICONDUCTOR DEVICE HAVING HIGH MOBILITY CHANNEL

(71) Applicant: QUALCOMM Incorporated, San Diego, CA (US)

(72) Inventors: Bin Yang, San Diego, CA (US); P R Chidambaram, San Diego, CA (US); John Jianhong Zhu, San Diego, CA (US); Jihong Choi, San Diego, CA (US); Da Yang, San Diego, CA (US); Ravi Mahendra Todi, San Diego, CA (US); Giridhar Nallapati, San Diego, CA (US); Chock Hing Gan, San Diego, CA (US); Ming Cai, San Diego, CA (US); Samit Sengupta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 14/040,366

(22) Filed: Sep. 27, 2013

(65) Prior Publication Data

US 2015/0091060 A1 Apr. 2, 2015

(51) Int. Cl.
*H01L 29/66* (2006.01)
*H01L 29/778* (2006.01)
*H01L 21/8238* (2006.01)

(52) U.S. Cl.
CPC .. *H01L 29/66431* (2013.01); *H01L 21/823807* (2013.01); *H01L 21/823814* (2013.01); *H01L 29/66545* (2013.01); *H01L 29/66651* (2013.01); *H01L 29/778* (2013.01)

(58) Field of Classification Search
CPC .................. H01L 21/823807; H01L 29/1054; H01L 29/66431; H01L 29/66545; H01L 29/66651; H01L 29/778; H01L 21/823814
See application file for complete search history.

(56) References Cited

U.S. PATENT DOCUMENTS

| | | | |
|---|---|---|---|
| 7,545,003 | B2 | 6/2009 | Majhi et al. |
| 8,384,167 | B2 | 2/2013 | Kikuchi et al. |
| 2006/0046399 | A1 | 3/2006 | Lindert et al. |
| 2009/0085125 | A1 | 4/2009 | Kim et al. |
| 2011/0183480 | A1 | 7/2011 | Chang |
| 2011/0227170 | A1 | 9/2011 | Zhu et al. |
| 2013/0087833 | A1 | 4/2013 | Wang |

FOREIGN PATENT DOCUMENTS

WO 2007115585 A1 10/2007

OTHER PUBLICATIONS

Noda T., et al., "Analysis of Dopant Diffusion and Defects in SiGe—channel Implant Free Quantum Well (IFQW) devices using an Atomistic Kinetic Monte Carlo Approach," IEEE International Electron Devices Meeting (IEDM), 2012, pp. 30.2.1-30.2.4.

(Continued)

*Primary Examiner* — Whitney T Moore
(74) *Attorney, Agent, or Firm* — Toler Law Group

(57) ABSTRACT

In a particular embodiment, a semiconductor device includes a high mobility channel between a source region and a drain region. The high mobility channel extends substantially a length of a gate. The semiconductor device also includes a doped region extending from the source region or the drain region toward the high mobility channel. A portion of a substrate is positioned between the doped region and the high mobility channel.

45 Claims, 19 Drawing Sheets

(56) References Cited

OTHER PUBLICATIONS

Rim, Ken, "32 nm and Beyond Transistor Enhancements: Mobility Enhancements," 2007 IEDM Short Course, 78 pp, see pp. 36 and 42.

Partial International Search Report for International Application No. PCT/US2014/054593, ISA/EPO, Date of Mailing Nov. 17, 2014, 7 pages.

International Search Report and Written Opinion—PCT/US2014/054593—ISA/EPO—Jan. 28, 2015.

SEMICONDUCTOR DEVICE HAVING HIGH MOBILITY CHANNEL

I. FIELD

The present disclosure is generally related to a semiconductor device having a high mobility channel and formation thereof.

II. DESCRIPTION OF RELATED ART

Advances in technology have resulted in smaller apparatuses and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

To increase mobility in a channel region of a semiconductor device, high mobility materials have been added to the channel region. A channel region with a high mobility channel may advantageously enable conductivity (e.g., high current) when the semiconductor device is in an on state. However, the use of high mobility materials in the channel region of a semiconductor device may create certain problems, such as increased substrate leakage (e.g., current leakage) when the semiconductor device is in an off state.

III. SUMMARY

The present disclosure provides a semiconductor device having a high mobility channel. The semiconductor device includes a gate, a source region, and a drain region. The gate is in contact with the high mobility channel region and the high mobility channel region may extend substantially a length of the gate. The high mobility channel may be configured to enable conductivity (e.g., high current) when the semiconductor device is in an on state. The high mobility channel does not contact a doped region, such as a lightly doped implant, associated with the source region or the drain region of the semiconductor device. A material may be positioned between the high mobility channel and the source region or positioned between the high mobility channel and the drain region. For example, a portion of a substrate of the semiconductor device may be positioned between the doped region and the high mobility channel. Accordingly, the high mobility channel and the doped region(s) is separated to reduce (e.g., limit) current leakage via the high mobility channel when the semiconductor device is in an off state. For example, a junction between the doped region and the high mobility channel may provide a barrier to reduce or inhibit current leakage in the off state.

In a particular embodiment, a semiconductor device includes a high mobility channel between a source region and a drain region. The high mobility channel extends substantially a length of a gate. The semiconductor device also includes a doped region extending from the source region or the drain region toward the high mobility channel. A portion of a substrate is positioned between the doped region and the high mobility channel.

In another particular embodiment, a method includes forming a doped region associated with a source region or a drain region of a semiconductor device. The method further includes forming a high mobility channel within the semiconductor device. The doped region is annealed prior to forming the high mobility channel. The doped region extends from the source region or the drain region toward the high mobility channel. A portion of a substrate of the semiconductor device is positioned between the doped region and the high mobility channel.

In another particular embodiment, an apparatus includes channel means for enabling a high-mobility carrier path between a source region and a drain region when a semiconductor device is in an on state. The channel means for enabling the high-mobility carrier path extends substantially a length of a gate of the semiconductor device. The apparatus further includes means for enabling current between the channel means for enabling the high-mobility carrier path and a doped region associated with one of the source region or the drain region. The means for enabling current is positioned between the doped region and the channel means for enabling the high-mobility carrier path.

In another particular embodiment, a method includes a first step for forming a doped region associated with a source region or a drain region of a semiconductor device. The method further includes a second step for forming a high mobility channel within the semiconductor device. The doped region extends from the source region or the drain region toward the high mobility channel and the doped region is annealed prior to forming the high mobility channel. A portion of a substrate of the semiconductor device is positioned between the doped region and the high mobility channel.

In another particular embodiment, a non-transitory computer readable medium includes instructions that, when executed by a processor, cause the processor to initiate formation of a semiconductor device. The semiconductor device formed by forming a doped region associated with a source region or a drain region of a semiconductor device. The semiconductor device further formed by forming a high mobility channel within the semiconductor device. The doped region extends from the source region or the drain region toward the high mobility channel and the doped region is annealed prior to forming the high mobility channel. A portion of a substrate of the semiconductor device is positioned between the doped region and the high mobility channel.

In another particular embodiment, a method includes receiving design information representing at least one physical property of a semiconductor device. The semiconductor device may include a high mobility channel between a source region and a drain region. The high mobility channel extends substantially a length of a gate. The semiconductor device also includes a doped region extending from the source region or the drain region toward the high mobility channel. A portion of a substrate is positioned between the doped region and the high mobility channel. The method further includes transforming the design information to comply with a file format. The method also includes generating a data file including the transformed design information.

In another particular embodiment, a method includes receiving, at a computer, design information including physical positioning information of a packaged semiconductor device on a circuit board. The packaged semiconductor device includes a semiconductor structure including a high mobility channel between a source region and a drain region. The high mobility channel extends substantially a length of a gate. The semiconductor structure also includes a doped region extending from the source region or the drain region toward the high mobility channel. A portion of a substrate is positioned between the doped region and the high mobility channel. The method further includes transforming the design information to generate a data file.

In another particular embodiment, a method includes receiving a data file including design information including physical positioning information of a packaged semiconductor device on a circuit board. The method also includes manufacturing the circuit board. The circuit board is configured to receive the packaged semiconductor device according to the design information. The packaged semiconductor device includes a high mobility channel between a source region and a drain region. The high mobility channel extends substantially a length of a gate. The packaged semiconductor device further includes a doped region extending from the source region or the drain region toward the high mobility channel. A portion of a substrate is positioned between the doped region and the high mobility channel.

One particular advantage provided by at least one of the disclosed embodiments is that a semiconductor device having a high mobility channel is formed. The semiconductor device may advantageously include a high mobility channel that enables conductivity (e.g., high current) when the semiconductor device is in an on state. For example, a junction between the doped region and the source/drain region may enable a high-mobility carrier path between the source/drain regions in the on state. Additionally, separation of the high mobility channel from the doped region(s) may advantageously reduce (e.g., limit) current leakage from the high mobility channel when the semiconductor device is in an off state. For example, a junction between the doped region and the high mobility channel may provide a barrier to reduce or inhibit current leakage in the off state.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description, common features are designated by common reference numbers throughout the drawings.

Figure 1:
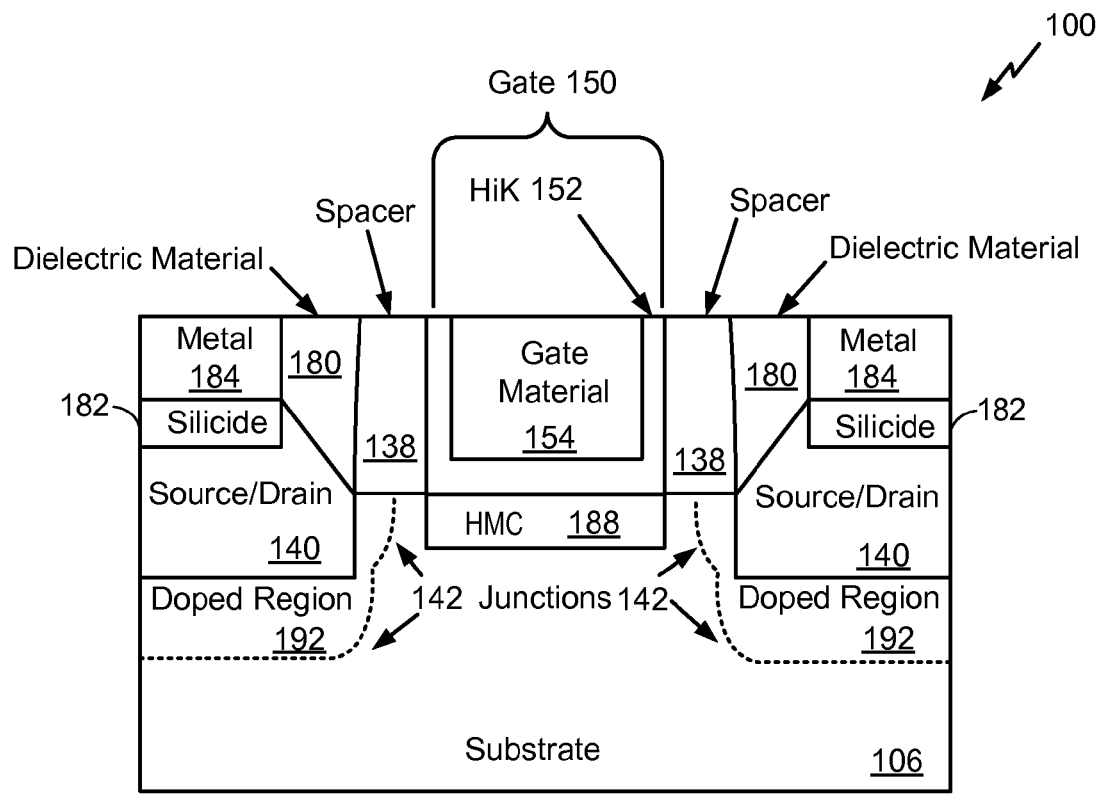
FIG. 1 is a diagram of a partial view of a semiconductor device including a high mobility channel.

Referring to FIG. 1, a diagram of a semiconductor device 100 including a high mobility channel is shown. The semiconductor device 100 may include a complementary metal-oxide-semiconductor (CMOS) device, such as a p-type metal-oxide-semiconductor (pMOS) device or an n-type metal-oxide-semiconductor (nMOS) device.

The semiconductor device 100 includes a substrate 106, such as a silicon (Si) substrate. The substrate 106 may include source/drain (S/D) regions 140 and a high mobility channel (HMC) 188. The source/drain regions 140 (e.g., source/drain implants) may include silicon germanium (SiGe), embedded silicon (e-Si), embedded silicon carbon (e-Si:C), or silicon doped with phosphorous (Si:P). Each of the source/drain regions 140 may be associated with a corresponding doped region 192, as described further herein. The doped region 192 may include an n-type dopant or a p-type dopant.

The high mobility channel 188 may include germanium (Ge), SiGe, a III-V material (e.g., gallium arsenide (GaAs), indium gallium arsenide (InGaAs), aluminium arsenide (AlAs), indium aluminium arsenide (InAlAs), indium arsenide (InAs), indium phosphide (InP), gallium phosphide (GaP), indium gallium phosphide (InGaP), indium antimonide (InSb), gallium antimonide (GaSb), indium gallium antimonide (InGaSb), gallium nitride (GaN), indium gallium nitride (InGaN), aluminium nitride (AlN), etc.), a II-VI material (e.g., cadmium telluride (CdTe), zinc telluride (ZnTe), zinc selenide (ZnSe), etc.), graphene, another high mobility material, or a combination thereof. The high mobility channel 188 may be positioned between a first source/drain region 140 (e.g., a source region) and a second source/drain region 140 (e.g., a drain region). As illustrated in FIG. 1, the semiconductor device 100 includes two source/drain regions 140, either of which may be the source region, while the other is the drain region.

A gate 150 may be coupled to (e.g., in contact with) the high mobility channel 188. The gate 150 may include a conformal oxide layer 152 (e.g., a high K (HiK) material) and gate material 154 (e.g., a metal). A spacer(s) 138 (e.g., silicon nitride (SiN)) may be coupled to the gate 150. The high mobility channel 188 may extend less than a length of the gate 150, more than the length of the gate 150, or substantially a length of the gate 150. As a first illustrative example, the high mobility channel 188 extends substantially the length of the gate 150 and has a length equal to the length of the gate 150, subject to variations caused by manufacturing processes. In a second illustrative example, the high mobility channel 188 extends under a spacer 138. In a third illustrative example, the high mobility channel does not extend under the spacer 138. A first portion of the spacer 138 may be in contact with the doped region 192 and a second portion of the spacer 138 may be in contact with the substrate 106. The doped region 192 may be in contact with a particular source drain region 140 (e.g., the source region or the drain region), the substrate 206, and a particular spacer 138. The doped region 192 may not be in contact with the high mobility channel 188.

A portion of a junction 142 may be positioned below the spacer(s) 138. The junction(s) 142 may be associated with a transition between a portion of the substrate 106 and the doped region 192. The junctions 142 of the doped regions 192 may not be in contact with the high mobility channel 188. For example, a portion of the substrate 106 (e.g., substrate material) may be positioned between a particular doped region 192 and the high mobility channel 188, such that the doped region 192 is not in contact with the high mobility channel 188. Although a material between the junctions 142 and the high mobility channel 188 is depicted as the substrate material, the material may be any material that provides a barrier to inhibit current leakage when the semiconductor device 100 in an off state.

The doped regions 192 may extend from the source/drain regions 140 to the junctions 142, such that the junctions 142 extend under the spacer 138 but do not extend under the gate 150. For example, a first doped region 192 may extend from the first source/drain region 140 (e.g., the source region) toward the high mobility channel 188, and a second doped region 192 may extend from the second source/drain region 140 (e.g., the drain region) toward the high mobility channel 188.

The semiconductor device may include silicides 182 and a metal 184. The silicides 182 may include nickel silicide (NiSi), platinum silicide (PtSi), titanium silicide (TiSi), or a combination thereof. The silicides 182 may be in contact with the source/drain regions 140. The metal 184, such as tungsten (W), may be connected to a corresponding silicide 182. The metal 184 may function as an electrode or as part of an electrode for a corresponding source/drain region 140.

During operation, the gate 150 and the metal 184 (e.g., source/drain electrodes) of the semiconductor device 100 may be biased in accordance with operation of the semiconductor device 100. For example, the semiconductor device 100 may include a transistor of a first type (e.g., a p-type metal-oxide-semiconductor (pMOS) device) or a second type (e.g., an n-type metal-oxide-semiconductor (nMOS) device). When the semiconductor device 100 is in an on state, the high mobility channel 188, the doped region 192, the junction 142, or a combination thereof, may enable a high-mobility carrier path from the first source/drain region (e.g., the source region) to the second source/drain region (e.g., the drain region). When the semiconductor device 100 is in an on state, the junctions 142 between the doped region and the high mobility channel, the material between the high mobility channel 188 and the doped region 192, or a combination thereof, may provide a barrier to inhibit current leakage.

The semiconductor device 100 may advantageously include a high mobility channel 188 that enables conductivity (e.g., high current) when the semiconductor device 100 is in an on state. For example, the high mobility channel 188, the doped region 192, and the source/drain region(s) 140, or a combination thereof, may enable a high-mobility carrier path between the source/drain regions in the on state. Additionally, separation of the high mobility channel 188 from the doped region(s) 192 may advantageously reduce (e.g., limit) current leakage via the high mobility channel 188 when the semiconductor device 100 is in an off state. For example, the junction(s) 142 between the doped region 192 and the high mobility channel 188 (including the substrate 206 between the doped region 192 and the high mobility channel 188) may provide a barrier to reduce or inhibit current leakage in the off state.

Figure 2:
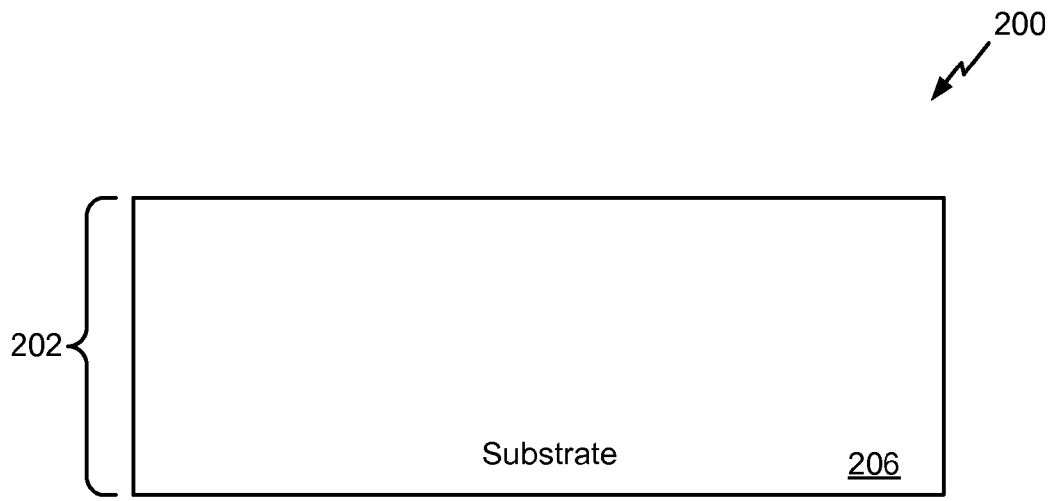
FIG. 2 is a first illustrative diagram of at least one stage of a process of fabricating a semiconductor device including a high mobility channel.

Referring to FIG. 2, a first illustrative diagram of at least one stage of a process of fabricating a semiconductor device including a high mobility channel is depicted and generally designated 200. The semiconductor device, such as a complementary metal-oxide-semiconductor (CMOS) device, may correspond to the semiconductor device 100 of FIG. 1. For example, the semiconductor device 100 may include a p-type metal-oxide-semiconductor (pMOS) channel mobility in a pMOS device (e.g., a p-type metal-oxide-semiconductor field effect transistor (pMOSFET) device) or an n-type metal-oxide-semiconductor (pMOS) channel mobility in an nMOS device (e.g., an n-type metal-oxide-semiconductor field effect transistor (pMOSFET) device). To form the semiconductor device, processing, such as CMOS processing, may be performed on a wafer 202 that includes a substrate 206 (e.g., a silicon (Si) substrate). The wafer 202 may include a silicon on insulator (SOI) structure, a silicon on silicon (SOS) structure, or a bulk silicon structure.

Figure 3:
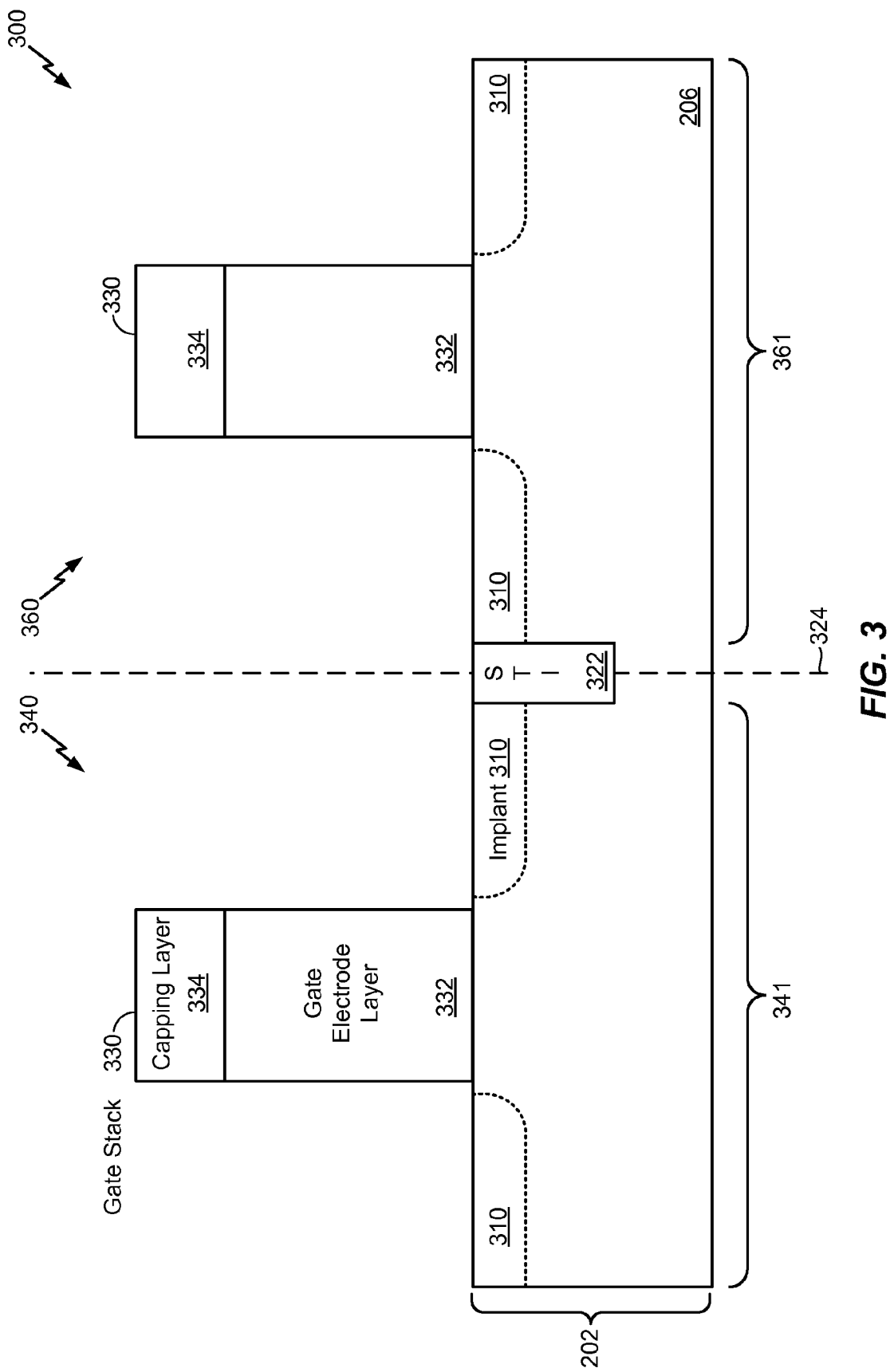
FIG. 3 is a second illustrative diagram of at least one stage of the process of fabricating the semiconductor device after forming one or more gate stacks of the semiconductor device.

Referring to FIG. 3, a second illustrative diagram of at least one stage of the process of fabricating the semiconductor device after forming one or more gate stacks of the semiconductor device is depicted and generally designated 300. A shallow trench isolation (STI) region 322, well implants 310, and gate stacks 330 may be formed. Back gate implantation, crystallization annealing, etching, patterning, and/or well implantation may be performed as part of or in addition to formation of one or more of the STI region 322, the well implants 310, and the gate stacks 330. The well implants 310 (e.g., a doped region) may be formed on the wafer 202 using an n-type dopant or a p-type dopant.

The STI region 322 may be formed through at least a portion of the substrate 206. The STI region 322 may divide the substrate 206 into a first portion 341 and a second portion 361 as indicated by dashed line 324. The first portion 341 may correspond to a first area 340 of associated with a first semiconductor device and the second portion 361 may correspond to a second area 360 associated with a second semiconductor device. The first area 340 may be designated for a first semiconductor device, such as a first transistor, and the second area 360 may be designated for a second semiconductor device, such as a second transistor. In a particular embodiment, the first semiconductor device of a first type is a p-type metal-oxide-semiconductor (pMOS) device (e.g., a p-type metal-oxide-semiconductor field effect transistor (pMOS-FET) device), such as the semiconductor device 100 of FIG. 1. In another particular embodiment, the second semiconductor device of a second type is an n-type metal-oxide-semiconductor (nMOS) device (e.g., an n-type metal-oxide-semiconductor field effect transistor (nMOSFET) device), such as the semiconductor device 100 of FIG. 1.

The gate stacks 330, such as dummy gate stacks, may be formed above the substrate 206. Each of the gate stacks 330 may include a capping layer 334 and a gate electrode layer 332. The capping layer 334 may include silicon nitride (SiN). The gate electrode layer 332 may include amorphous silicon (a-Si) or polysilicon. A first gate stack 330 of the first area 340 is formed above the first portion 341 of the substrate 206 and a second gate stack 330 of the second area 360 is formed above the second portion 361 of the substrate 206.

Figure 4:
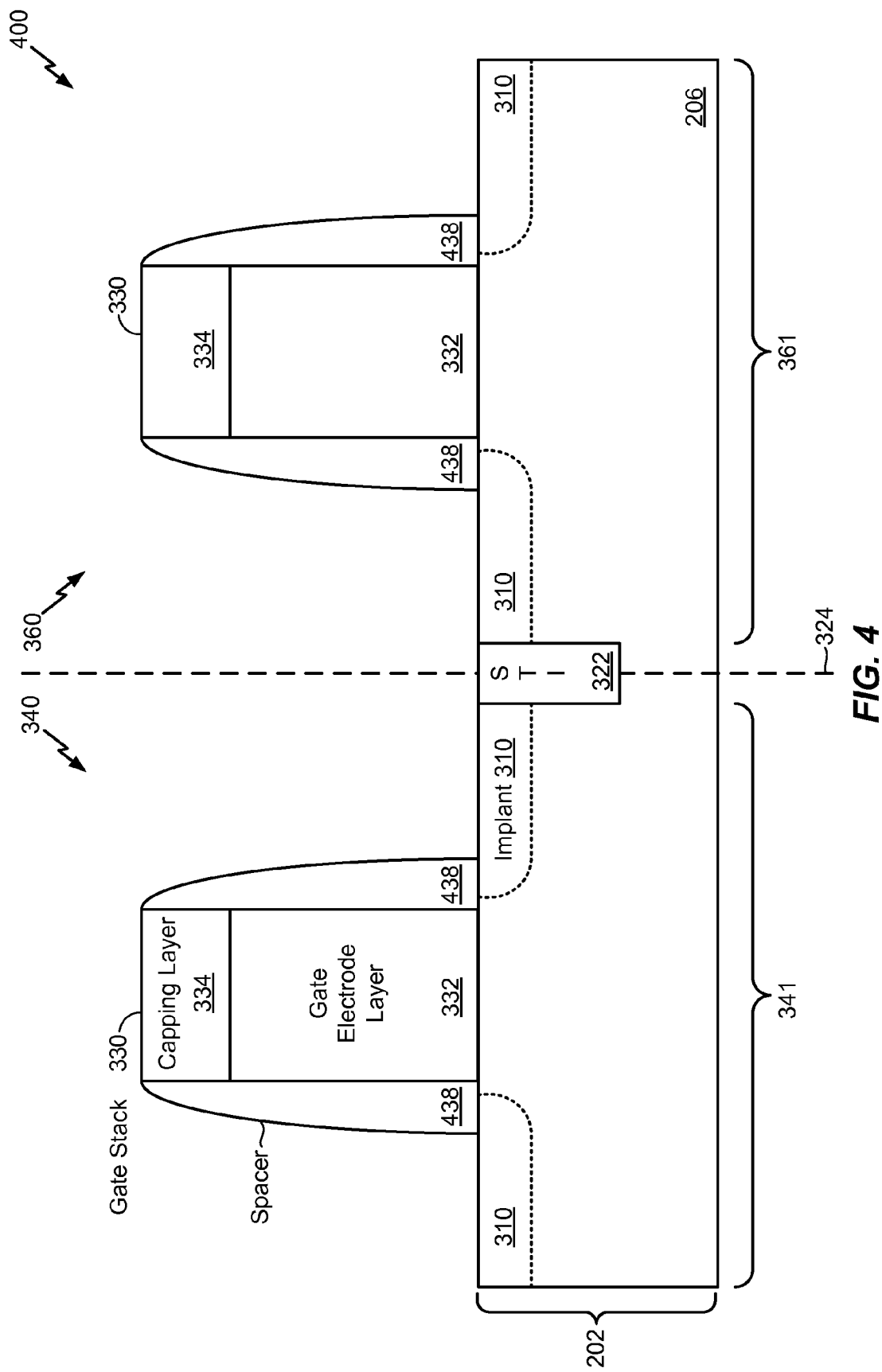
FIG. 4 is a third illustrative diagram of at least one stage of the process of fabricating the semiconductor device after forming spacers on the one or more gate stacks.

Referring to FIG. 4, a third illustrative diagram of at least one stage of the process of fabricating the semiconductor device after forming spacers on the one or more gate stacks is depicted and generally designated 400. Spacers 438 may be formed on the gate stack(s) 330. For example, the spacers 438 may be formed on the gate electrode layer 332 and on the capping layer 334. The spacers 438 may be formed above substrate 206. The spacers 438 may include silicon nitride (SiN). Back gate implantation, crystallization annealing, etching, patterning, and/or extension implantation may be performed as part of or in addition to formation of the spacers 438.

Figure 5:
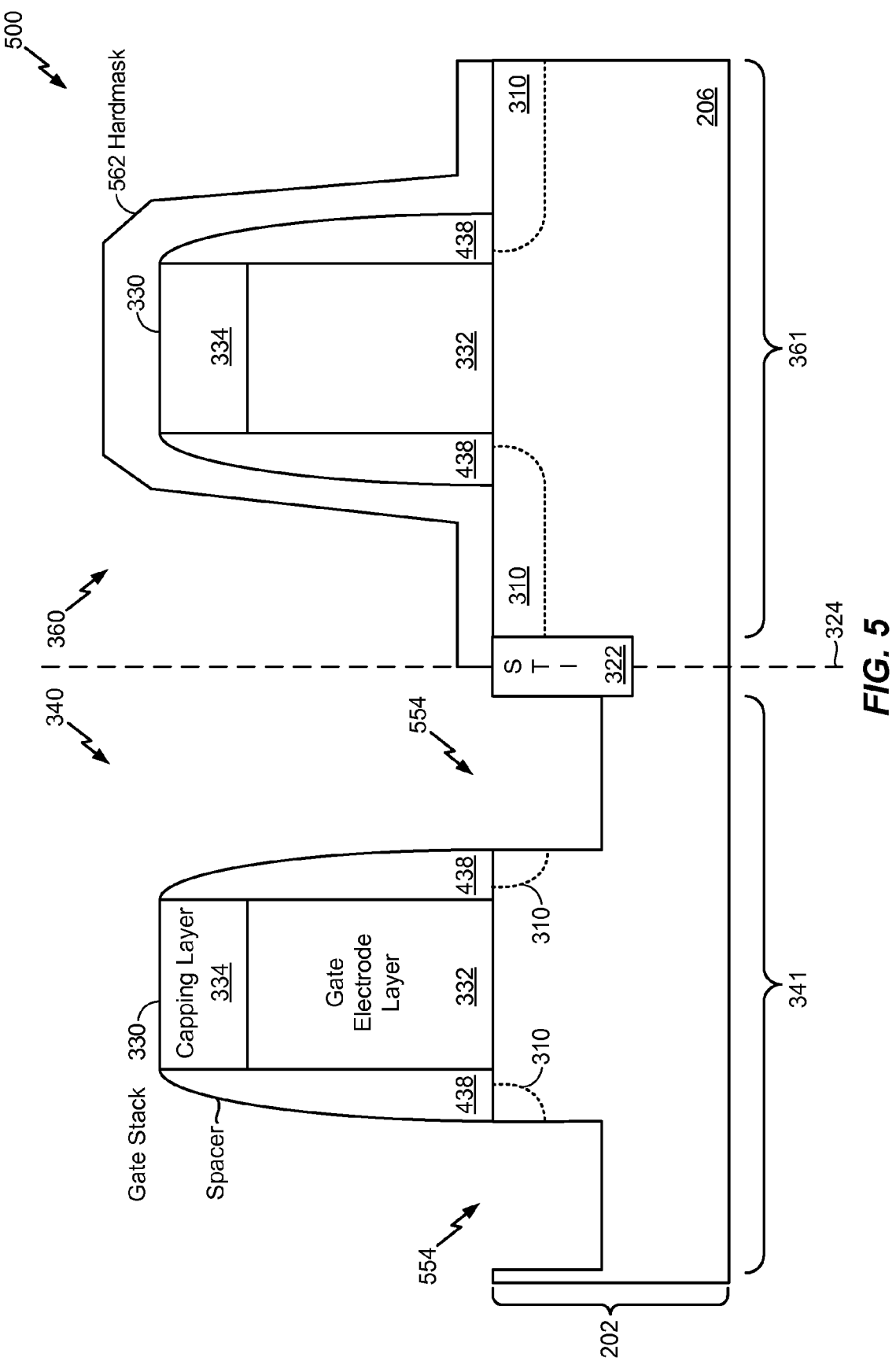
FIG. 5 is a fourth illustrative diagram of at least one stage of the process of fabricating the semiconductor device after forming a hardmask above a first portion of a substrate and after removing a portion of the substrate from a second portion of the substrate.

Referring to FIG. 5, a third illustrative diagram of at least one stage of the process of fabricating the semiconductor device after forming a hardmask above a second portion of a substrate and after removing a portion of the substrate from a first portion of the substrate is depicted and generally designated 500. A hardmask 562 may be deposited over the second portion 361 of the substrate 206. For example, the hardmask 562 may be deposited on the gate stack 330, the spacers 438, and the well implants 310 of the second area 360.

A portion of the substrate 206 associated with the first portion 341 may be selectively removed. Removing the portion of the substrate may create source/drain cavities 554, such as trenches, recessed into the first portion 341 (e.g., a pMOS portion) of the wafer 202 for source/drain deposition (e.g., silicon germanium SiGe deposition). The source/drain cavities 554 may be formed using an etch process.

Figure 6:
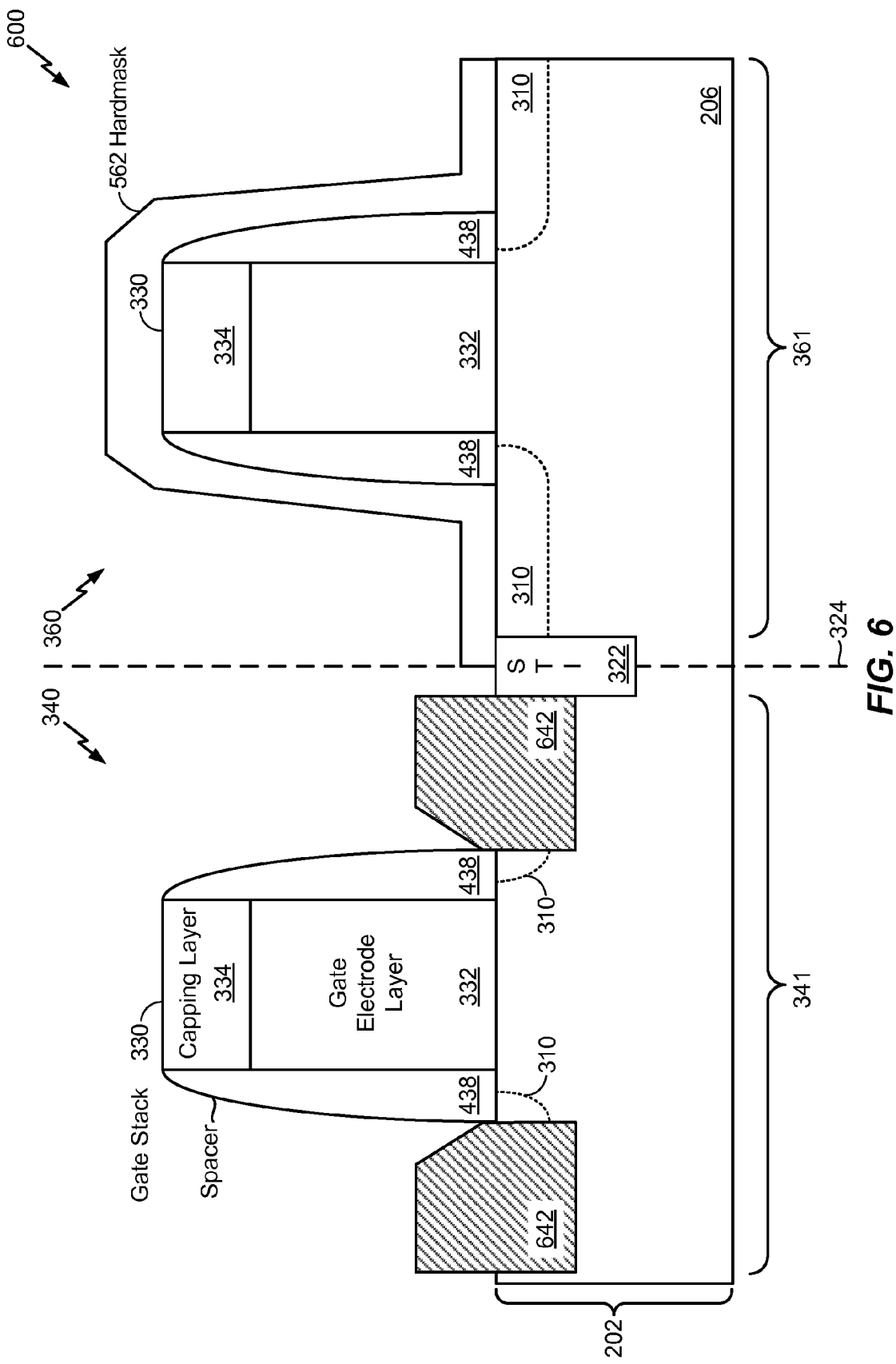
FIG. 6 is a fifth illustrative diagram of at least one stage of the process of fabricating the semiconductor device after forming a source/drain region on the second portion of the substrate.

Referring to FIG. 6, a fifth illustrative diagram of at least one stage of the process of fabricating the semiconductor device after forming a source/drain region on the first portion of the substrate is depicted and generally designated 600. Source/drain regions 642 associated with the first portion 341 may be formed (e.g., raised above the substrate 206 on the first area 340). The source/drain regions 642 may be epitaxial deposited (e.g., epitaxially grown) on an exposed portion of the substrate 206. For example, the source/drain regions 642 may be epitaxially deposited using in-situ doping. Each of the source/drain regions 642 may be formed at least partially in a corresponding source/drain cavity 554 (e.g., a corresponding trench) of the substrate 206. The source/drain regions 642 may include embedded-silicon germanium (e-SiGe). For example, the source/drain (S/D) regions 642, such as SiGe regions, may be raised on the pMOS portion, such as the first portion 341, of the wafer 202.

Figure 7:
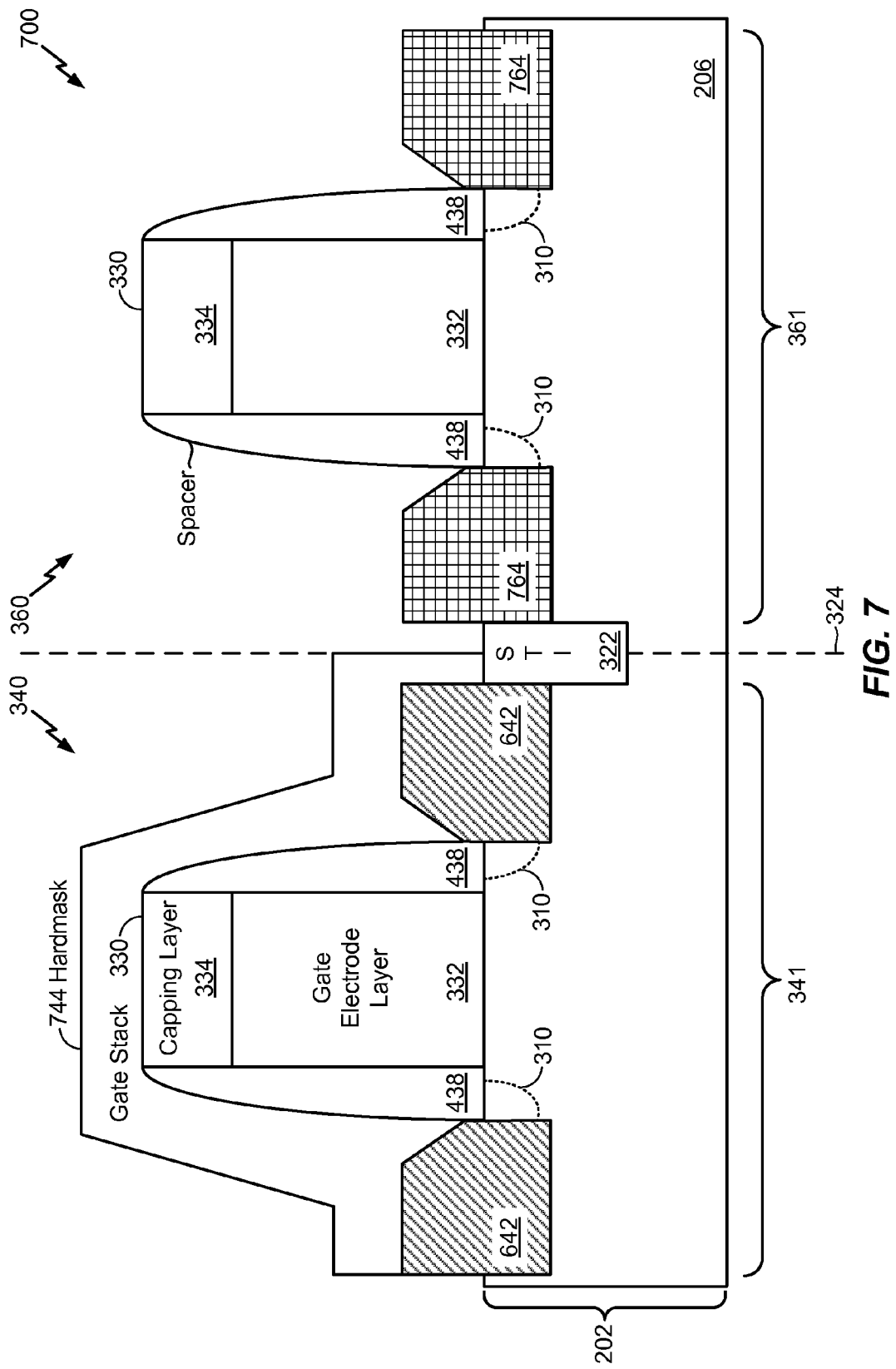
FIG. 7 is a sixth illustrative diagram of at least one stage of the process of fabricating the semiconductor device after forming a hardmask over the second portion of the substrate and forming a source/drain region on the first portion of the substrate.

Referring to FIG. 7, a sixth illustrative diagram of at least one stage of the process of fabricating the semiconductor device after forming a hardmask over the first portion of the substrate and forming a source/drain region on the second portion of the substrate is depicted and generally designated 700.

The hardmask 562 may be removed from the second portion 361 of the substrate 206. A hardmask 744 may be deposited over the first portion 341 of the substrate 206. For example, the hardmask 744 may be deposited on the gate stack 330, the spacers 438, and the source/drain regions 642 of the first area 340.

Source/drain regions 764 associated with the second portion 361 may be formed (e.g., raised above the substrate 206 on the second area 360). Each of the source/drain regions 764 may be formed at least partially in a trench of the substrate 206. A portion of the substrate 206 may be selectively removed above the second portion 361. Removing the portion of the substrate 206 may create source/drain cavities, such as trenches, recessed into the second portion 361 (e.g., an nMOS portion) of the wafer 202 for source/drain deposition (e.g., embedded-silicon (e-Si) deposition or embedded-silicon carbide (eSi:C) deposition). The source/drain cavities may be formed using an etch process.

The source/drain regions 764 may be raised above the substrate 206 on the second area 360. For example, the source/drain regions 764 may be epitaxially deposited using in-situ doping. Each of the source/drain regions 764 may be formed at least partially in a trench of the substrate 206. For example, the source/drain (S/D) regions 764 may be raised on the nMOS portion, such as the second portion 361, of the wafer 202.

The source/drain regions 764 may include silicon (Si), silicon carbon (Si:C), or another material that increases channel mobility in an n metal-oxide-semiconductor (nMOS) device (e.g., an n-type metal-oxide-semiconductor field effect transistor (nMOSFET)). For example, the source/drain regions 764 include embedded silicon (e-Si) or embedded silicon carbon (e-Si:C). For example, the source/drain (S/D) regions 764 may be raised on the nMOS portion, such as the second portion 361, of the wafer 202.

Figure 8:
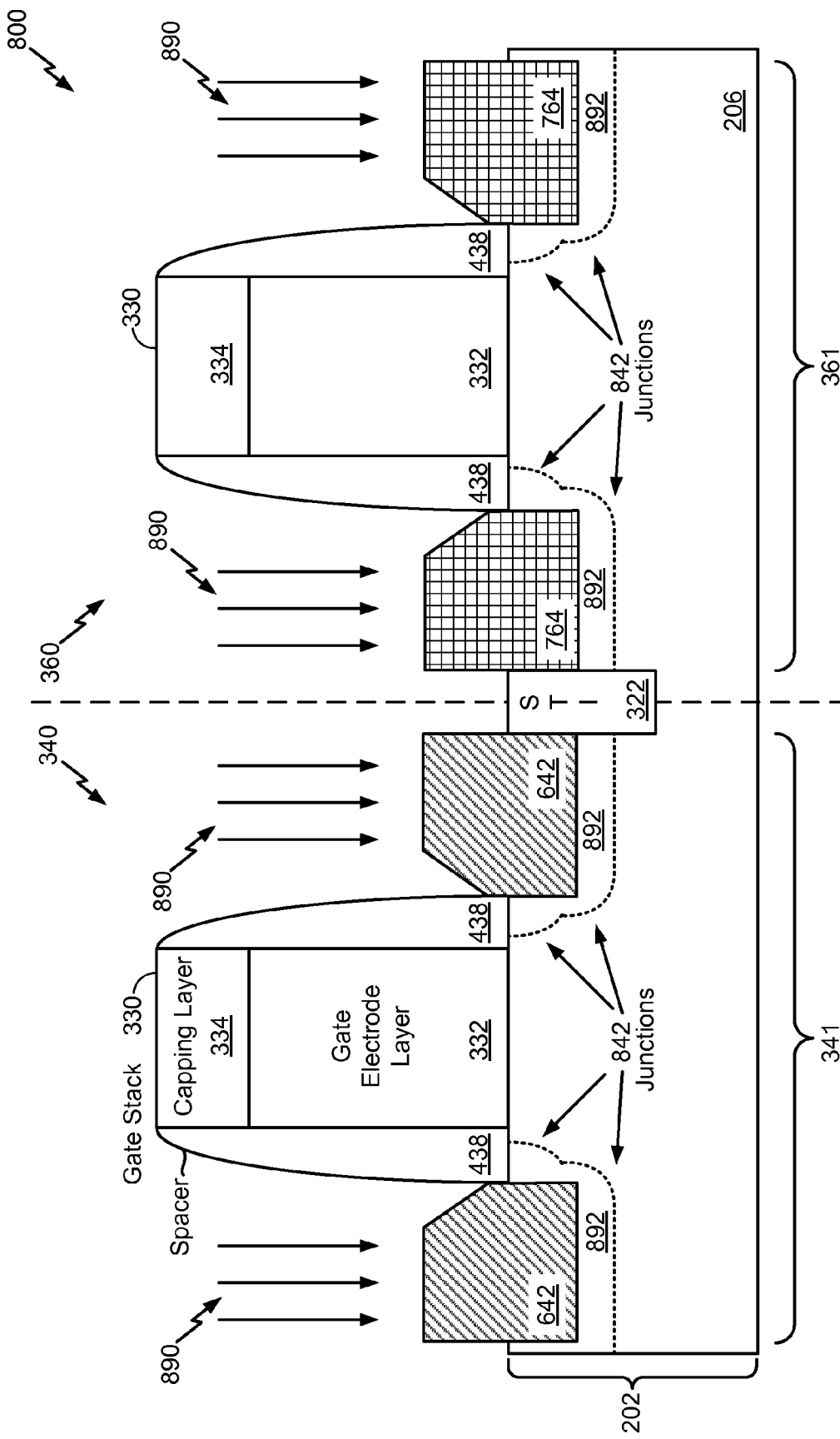
FIG. 8 is a seventh illustrative diagram of at least one stage of the process of fabricating the semiconductor device after removing the hardmask over the first portion of the substrate and during application of doping implants to source/drain regions of the semiconductor device.

Referring to FIG. 8, a seventh illustrative diagram of at least one stage of the process of fabricating the semiconductor device after removing the hardmask the first portion of the substrate and during application of doping implants to source/drain regions of the semiconductor device is depicted and generally designated 800. The hardmask 744 of FIG. 7 may be removed from the first area 340. If the source/drain regions 642 were not deposited with in-situ doping, doping implants 890 may be applied to the source/drain regions 642. Likewise, if the source/drain regions 764 were not deposited with in-situ doping, doping implants 890 may be applied to the source/drain regions 764. The doping implants 890 of the first area 340 may be different doping implants than the doping implants 890 of the second area 360. The doping implants 890 may result in a doped region 892 below (and/or next to) the source/drain regions 642, 764 (e.g., the SiGe implants of the pMOS side of the first area 340 and the e-Si or eSi:C of the nMOS side of the second area 360). For example, the doped regions 892 of the first portion 341 may include the well implants 310 of FIGS. 3-7 next to the source/drain regions 642 and including the doped regions 892 under the source/ drain regions 642. As another example, the doped regions 892 of the second portion 361 may include the well implants 310 of FIGS. 3-7 next to the source/drain regions 764 and including the doped regions 892 under the source/drain regions 764. Accordingly, source/drain regions 642, 764 of the first area 340 and the second area 360 may have doped regions 892 extending below the source/drain regions 642, 764 and extending from the source/drain regions 642, 764 partially under the spacers 438. If the source/drain regions 642, 762 were in-situ doped, the doping implants 890 may not be applied because the doped regions 892 would already be present as a result of the in-situ doping process.

Rapid thermal annealing (RTA), laser annealing (LSA), or a combination thereof, is performed on the first area 340 and the second area 360 to diffuse the doped regions 892 (e.g., the doped regions 892 including the well implants 310 next to the source/drain regions 642, 764 and including the doped regions 892 under the source/drain regions 642, 764). The annealing may heal damage to the substrate 206 caused by implanting the source/drain regions 642, 764 and may form (e.g., define) junctions 842 along a profile of the doped regions 892. The junctions 842 may represent a transition for the doped region 892 to a material of the substrate 206 (or another material positioned between the doped region 892 and a channel region of the first portion 341 or the second portion 361. As a result of the annealing, the junctions 842 may remain under a respective spacer 438 (and may not extend into a channel region under a corresponding gate stack 330). In a particular embodiment, the laser annealing is used to control diffusion of the doped region 892 during annealing. Additionally or alternatively, rapid thermal annealing (RTA), laser scribe annealing (LSA), or a combination thereof may also be performed to densify the spacers 438.

Figure 9:
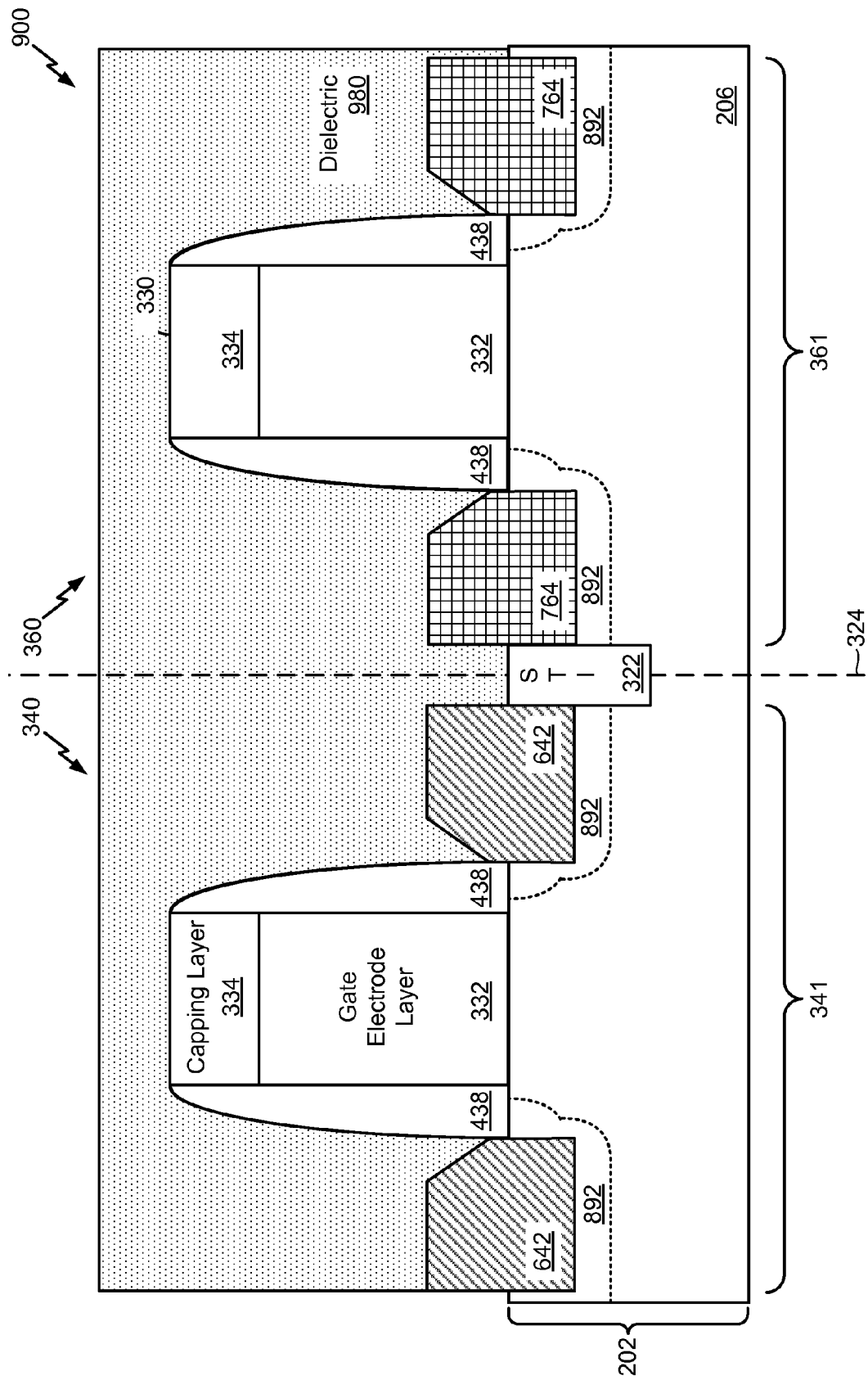
FIG. 9 is an eighth illustrative diagram of at least one stage of the process of fabricating the semiconductor device after a dielectric material is deposited above a wafer.

Referring to FIG. 9, an eighth illustrative diagram of at least one stage of the process of fabricating the semiconductor device after a dielectric material is deposited above a wafer is depicted and generally designated 900. A dielectric layer 980 may be deposited above the wafer 202. For example, the dielectric layer 980 may be the dielectric 180 of FIG. 1. The dielectric layer 980 may include a silicon-containing material.

Figure 10:
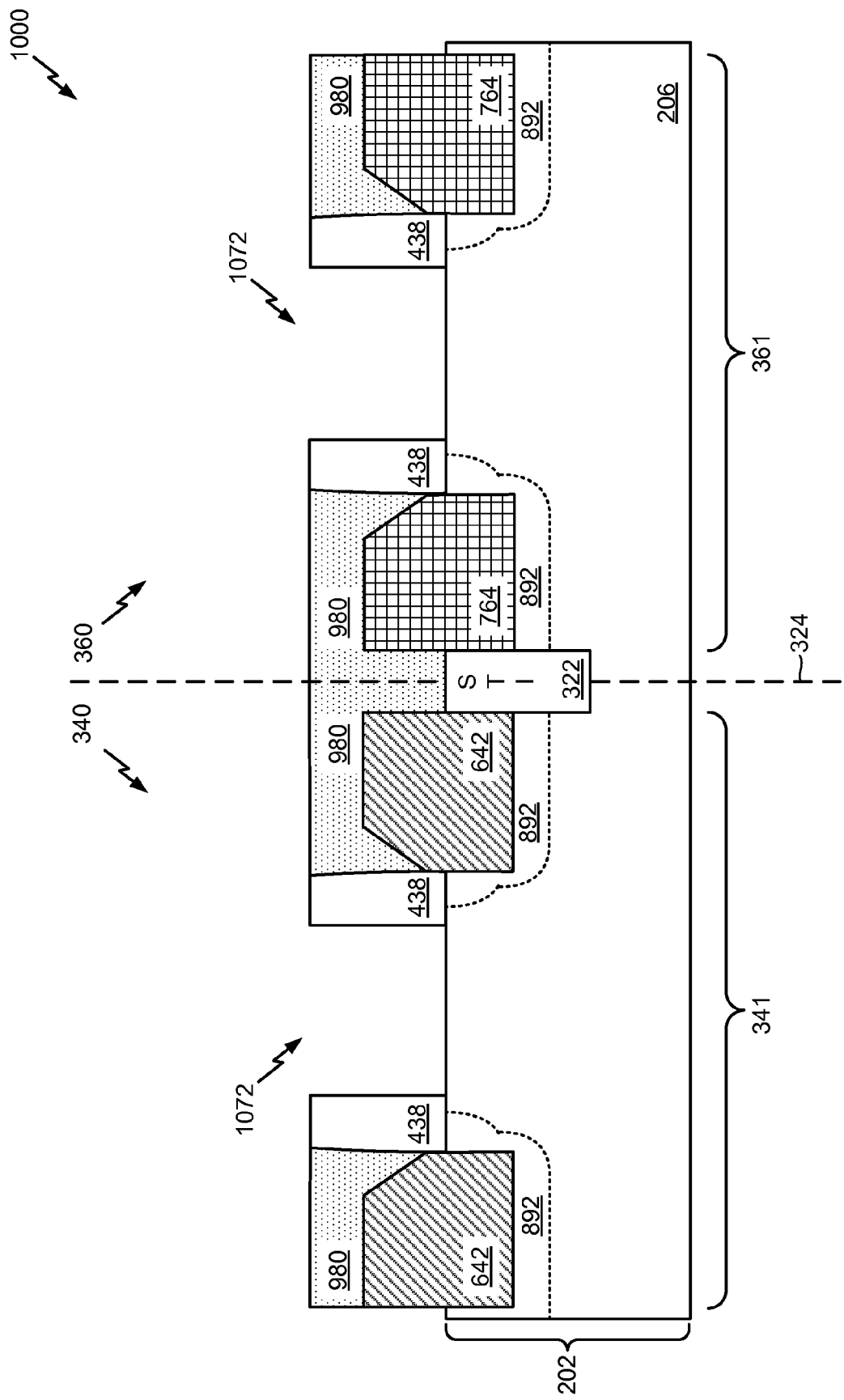
FIG. 10 is a ninth illustrative diagram of at least one stage of the process of fabricating the semiconductor device after planarization is performed and after a portion of each gate stack is removed.

Referring to FIG. 10, a ninth illustrative diagram of at least one stage of the process of fabricating the semiconductor device after planarization is performed and after a portion of each gate stack is removed is depicted and generally designated 1000. A chemical mechanical planarization (CMP) (e.g., a chemical mechanical polish) may be performed to remove a portion of the dielectric layer 980 of FIG. 9, a portion of the gate stacks 330 of FIGS. 3-9, and a portion of the spacers 438 of FIGS. 4-9. In a particular embodiment, the CMP polish removes the capping layers 334 of FIGS. 3-8 and a portion of the gate electrode layer 332 of FIGS. 3-8. The gate electrode layer 332 may be removed from each of the gate stacks 330 to establish cavities 1072 associated with the first area 340 and the second area 360. For example, the gate electrode layer 332 may be etched out of each of the gate stacks 330. In a particular embodiment, the gate electrode layer 332 includes amorphous silicon (a-Si) which is removed from each gate stack 330. The gate electrode layer 332 may be removed using a dry etch, a wet etch, or a combination thereof. The cavity 1072 may expose a portion of the substrate 206 associated with a channel region of each of the first portion 341 and the second portion 361.

Figure 11:
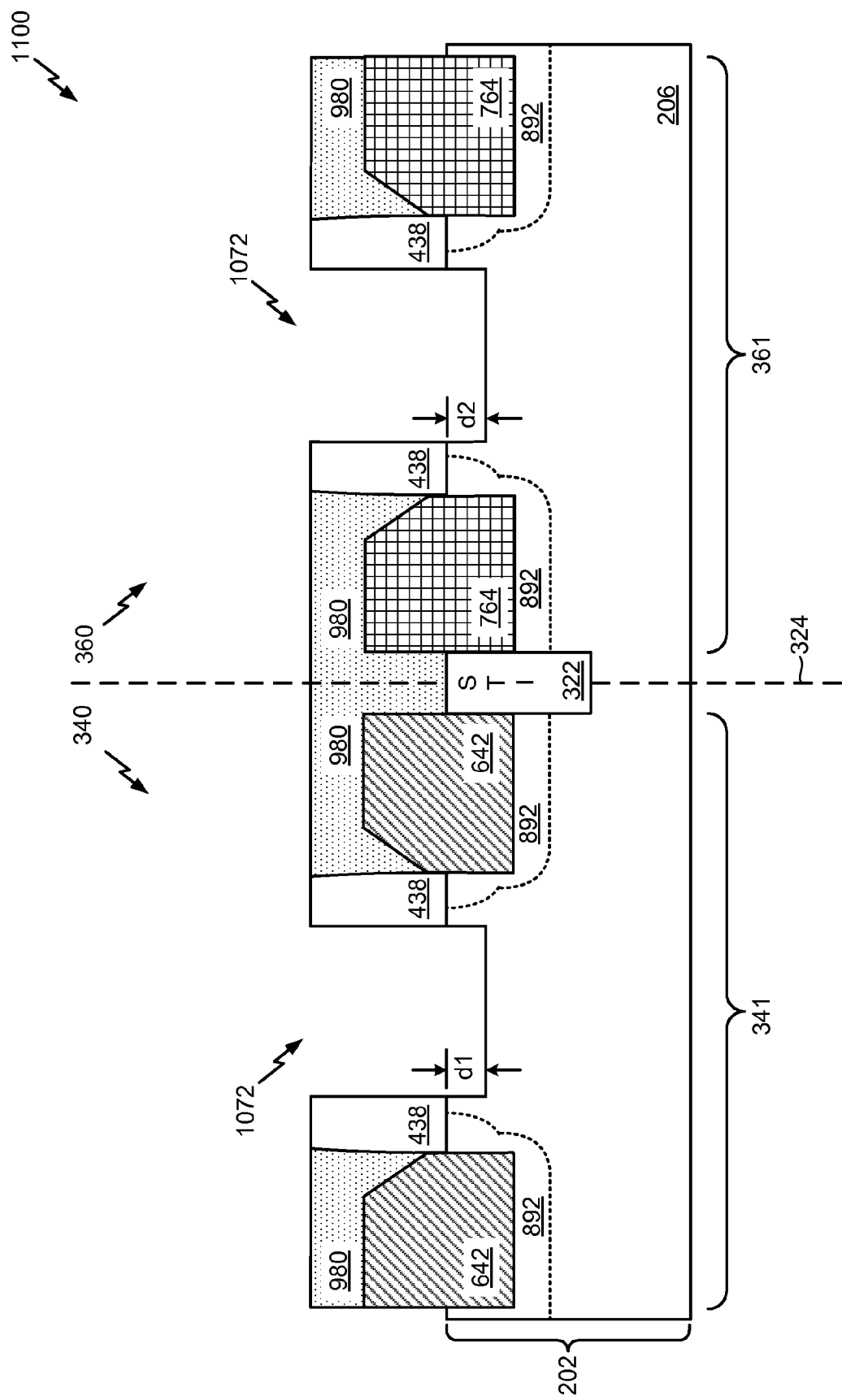
FIG. 11 is a tenth illustrative diagram of at least one stage of the process of fabricating the semiconductor device after a portion of the substrate is selectively removed to extend a cavity.

Referring to FIG. 11, a tenth illustrative diagram of at least one stage of the process of fabricating the semiconductor device after a portion of the substrate is selectively removed to extend a cavity is depicted and generally designated 1100. A portion of the substrate 206 may be selectively removed from the first portion 341 and the second portion 361. For example, the cavity 1072 of the first portion 341 of FIG. 10 may be extended into a channel region of the first portion 341 and the cavity 1072 of the second portion 361 of FIG. 10 may be extended into a channel region of the second portion 361. An etch process may be used to remove the portion of the substrate 206. Removing the portion of the substrate 206 may not affect the junctions 142 because the junctions 142 do not extend beyond the spacers 438. Accordingly, material of the substrate 206 (e.g., silicon) is positioned between the extended cavity 1072 and the junctions 142 (e.g., a junction previously formed by annealing).

The cavity 1072 of the first portion 341 of FIG. 10 may be extended into the first portion 341 to a first depth d1 and the cavity 1072 of the second portion 361 of FIG. 10 may be extended into the second portion 361 to a second depth d2. The first depth d1 and the second depth d2 may be the same depth or may be different depths. For example, the first depth d1 may be larger than the second depth d2. As another example, the first depth d1 may be smaller than the second depth d2. As another example, the first depth d1 may be a same depth as the second depth d2.

To extend the cavity 1072 of the first portion 341 of FIG. 10 to a different depth than the cavity 1072 of the second portion 361 of FIG. 10, multiple etchings may be performed in combination with one or more hardmasks.

As a first illustrative, non-limiting example, a first hardmask may be deposited over the second portion 361 of the substrate 206. A first etch process may be performed on the first portion 341 to extend the cavity 1072 of the first portion 341 of FIG. 10 to the first depth d1 after the first hardmask is deposited. After the cavity 1072 of the first portion 341 is extended to the first depth d1, the first hardmask may be removed from the second portion 361 and a second hardmask may be deposited over the first portion 341. A second etch process may be performed on the second portion 361 to extend the cavity 1072 of the second portion 361 of FIG. 10 to the second depth d2 after the second hardmask is deposited. After the cavity 1072 of the second portion 361 is extended to the second depth d3, the second hardmask may be removed from the first portion 341.

As a second illustrative, non-limiting example, a first etch process may be performed on the first portion 341 and the second portion 361 to extend the cavities 1072 of the first portion 341 and the second portion 361 of FIG. 10 to a particular depth. The particular depth may be the first depth d1 or the second depth d2. After the first etch is applied, a hardmask may be deposited over the first portion 341 or the second portion 361. If the hardmask is deposited over the first portion 341, a second etch process may be performed on the second portion 361 to further extend the cavity 1072 of the second portion 361 to the second depth d2, such that the second depth d2 is larger than the particular depth (e.g., the first depth d1) of the cavity 1072 of the first portion 341. If the hardmask is deposited over the second portion 341, the second etch process may be performed on the first portion 361 to further extend the cavity 1072 of the first portion 341 to the first depth d1, such that the first depth d1 is larger than the particular depth (e.g., the second depth d2) of the cavity 1072 of the second portion 361. After the second etch is performed, the hardmask may be removed.

Figure 12:
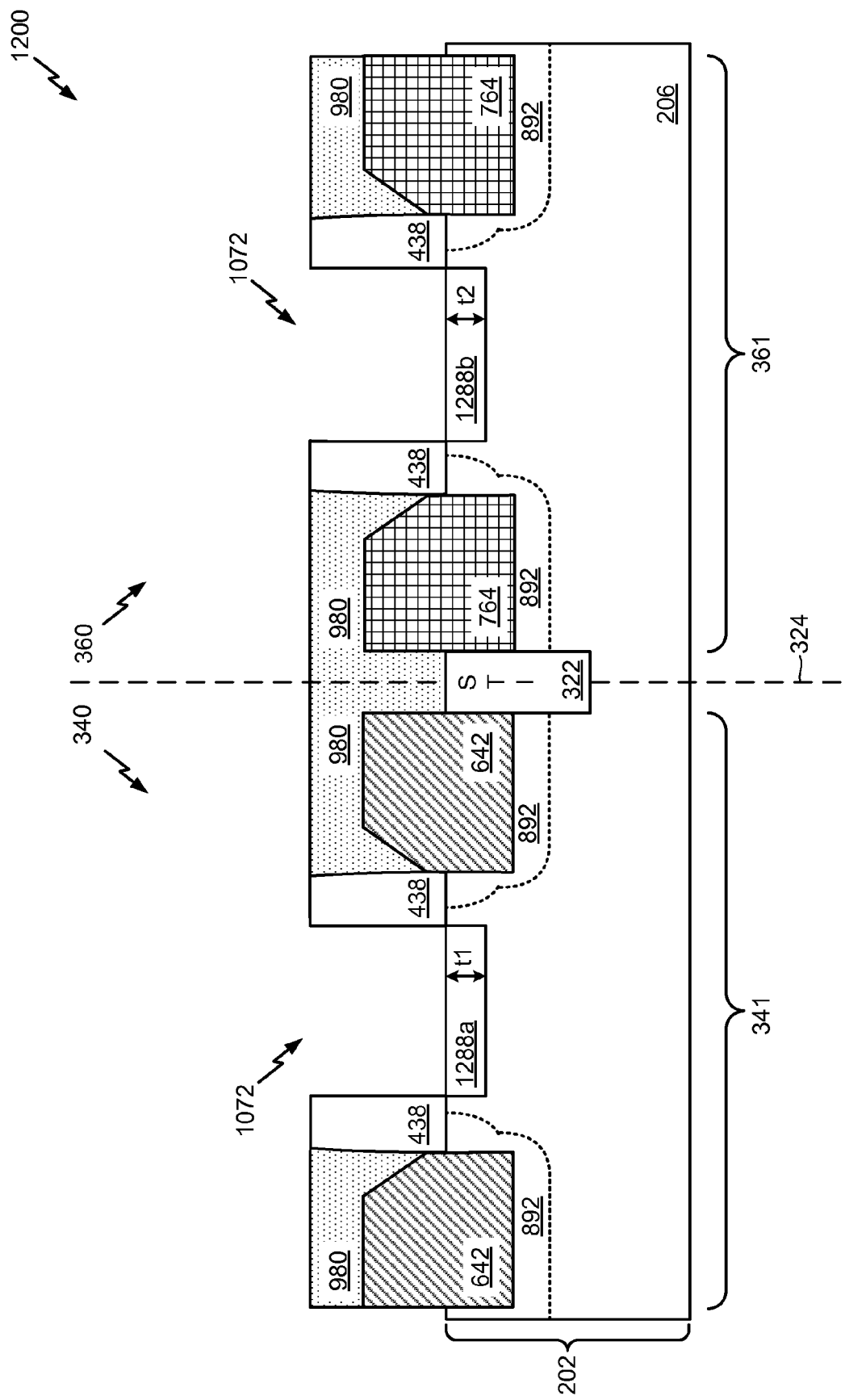
FIG. 12 is an eleventh illustrative diagram of at least one stage of the process of fabricating the semiconductor device after filling a portion of the cavity to create a high mobility channel.

Referring to FIG. 12, an eleventh illustrative diagram of at least one stage of the process of fabricating the semiconductor device after filling a portion of the cavity to create a high mobility channel is depicted and generally designated 1200. A high mobility material is epitaxially grown (e.g., deposited)

in the extended cavities 1072 of FIG. 11 (e.g., in the channel region) to form high mobility channels 1288a, 1288b associated with the first portion 341 and the second portion 361, respectively. The high mobility channel material may fill at least a portion of the extended cavity 1072 of FIG. 11. The high mobility material may include germanium (Ge), a III-V material, a II-VI material, graphene, another high mobility material, or a combination thereof.

The high mobility channel 1288a of the first portion 341 may be a first thickness t1 and the high mobility channel 1288b of the second portion 361 may be a second thickness t2. The first thickness t1 and the second thickness t2 may be the same thickness or may be different thicknesses. For example, the first thickness t1 may be larger than the second thickness t2. As another example, the first thickness t1 may be smaller than the second thickness t2. As another example, the first thickness t1 may be a same thickness as the second thickness t2. A first material of the high mobility channel 1288a of the first portion may be the same material or a different material as a second material of the high mobility channel 1288b of the second portion 361, as described with reference to FIG. 14B.

To form the high mobility channel 1288a of the first portion 341 to a different thickness than the high mobility channel 1288b of the second portion 361, multiple epitaxial growths may be performed in combination with one or more hardmasks.

As a first illustrative, non-limiting example, a first hardmask may be deposited over the second portion 361 of the substrate 206. The high mobility channel 1288a of the first portion 341 may be epitaxially grown in the extended cavity 1072 of the first portion 341 when the first hardmask is positioned over the second portion 361. After the high mobility channel 1288a of the first portion 341 is formed, the first hardmask may be removed from the second portion 361 and a second hardmask may be deposited over the first portion 341. The high mobility channel 1288b of the second portion 361 may be epitaxially grown in the extended cavity 1072 of the second portion 361 when the second hardmask is positioned over the first portion 341. After the high mobility channel 1288b of the second portion 361 is formed, the second hardmask may be removed from the first portion 341.

As a second illustrative, non-limiting example, a first epitaxial growth may be performed on the extended cavities 1072 of the first portion 341 and the second portion 361 to form at least a portion of high mobility channels 1288a, 1288b to a particular thickness. The particular thickness may be the first thickness t1 or the second thickness t2. After the first epitaxial growth is performed, a hardmask may be deposited over the first portion 341 or the second portion 361. If the hardmask is deposited over the first portion 341, a second epitaxial growth may be performed on the second portion 361 to further form the high mobility channel 1288b of the second portion 361 to the second thickness t2, such that the second thickness t2 is larger than the particular thickness (e.g., the first thickness t1) of the high mobility channel 1288a of the first portion 341. If the hardmask is deposited over the second portion 341, the second epitaxial growth may be performed on the first portion 361 to further form the high mobility channel 1288a of the first portion 341 to the first thickness t1, such that the first thickness t1 is larger than the particular thickness (e.g., the second thickness t2) of the high mobility channel 1288b of the second portion 361. After the second epitaxial growth is performed, the hardmask may be removed.

The first thickness t1 of the high mobility channel 1288a of the first portion 341 may be the same as or different than the first depth d1 that the cavity 1072 of the first portion 341 is extended in FIG. 11. For example, the first thickness t1 of the high mobility channel 1288a of the first portion 341 of FIG. 12 may be larger than the first depth d1 that the cavity 1072 of the first portion 341 is extended in FIG. 11. As another example, the first thickness t1 of the high mobility channel 1288a of the first portion 341 of FIG. 12 may be smaller than the first depth d1 that the cavity 1072 of the first portion 341 is extended in FIG. 11. As another example, the first thickness t1 of the high mobility channel 1288a of the first portion 341 of FIG. 12 may be the same as the first depth d1 that the cavity 1072 of the first portion 341 is extended in FIG. 11. Additionally or alternatively, the second thickness t2 of the high mobility channel 1288b of the second portion 361 may be the same as or different than the second depth d2 that the cavity 1072 of the second portion 361 is extended in FIG. 11. For example, the second thickness t2 of the high mobility channel 1288b of the second portion 361 of FIG. 12 may be larger than the second depth d2 that the cavity 1072 of the second portion 361 is extended in FIG. 11. As another example, the second thickness t2 of the high mobility channel 1288b of the second portion 361 of FIG. 12 may be smaller than the second depth d2 that the cavity 1072 of the second portion 361 is extended in FIG. 11. As another example, the second thickness t2 of the high mobility channel 1288b of the second portion 361 of FIG. 12 may be the same as the second depth d2 that the cavity 1072 of the second portion 361 is extended in FIG. 11.

Figure 13:
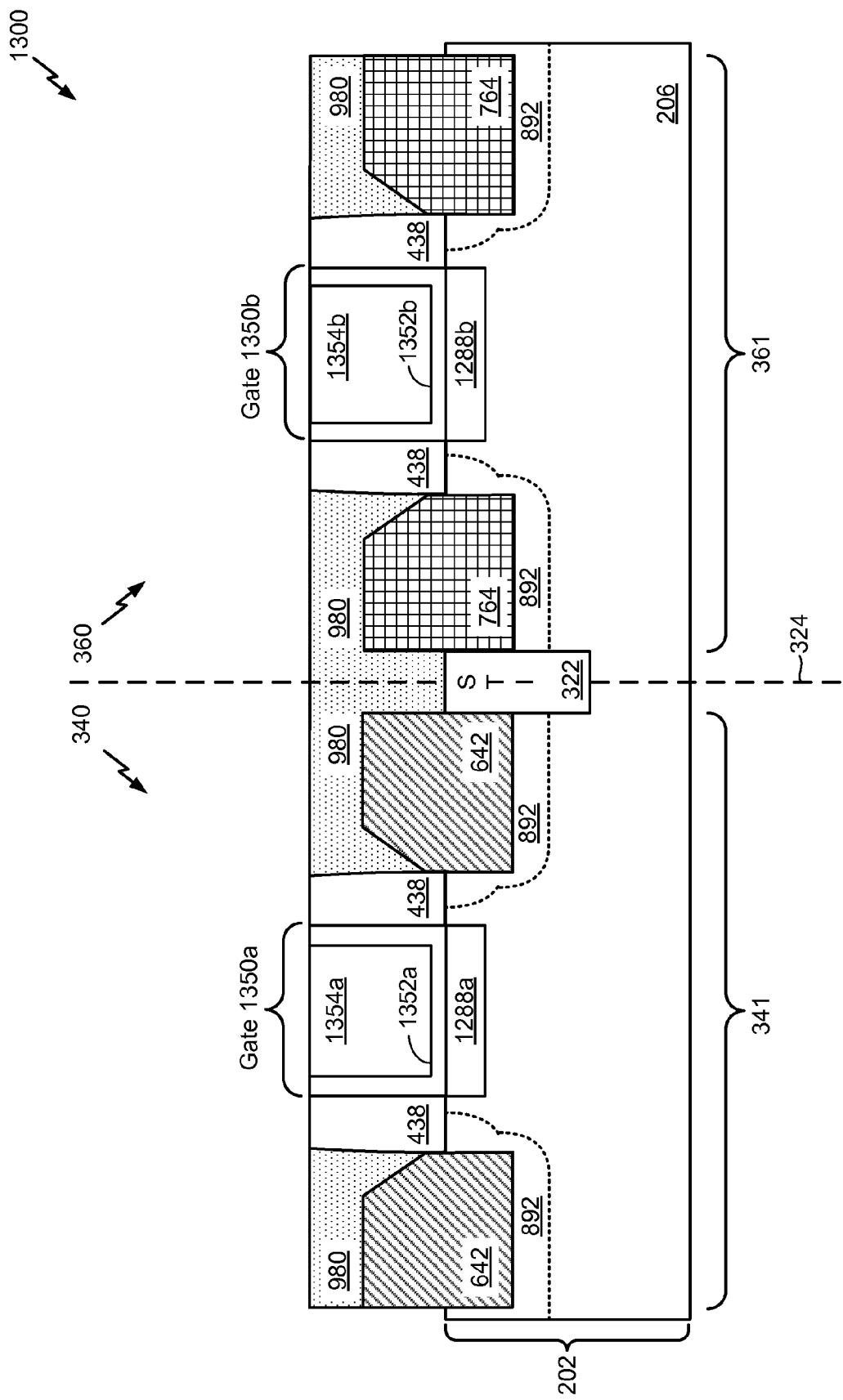
FIG. 13 is a twelfth illustrative diagram of at least one stage of the process of fabricating the semiconductor device after forming a gate above the high mobility channel.

Referring to FIG. 13, a twelfth illustrative diagram of at least one stage of the process of fabricating the semiconductor device after forming a gate above each the high mobility channel is depicted and generally designated 1300. A gate 1350a, 1350b (e.g., a gate stack) may be formed in each the cavities 1072 of FIGS. 10-12. Each gate 1350a, 1350b may include a gate oxide layer 1352a, 1352b and a metal gate layer 1354a, 1354b, respectively. The gate oxide layers 1352a, 1352b may be formed using atomic layer deposition (ALD). For example, the gate oxide layers 1352a, 1352b may include a conformal gate oxide layer having a substantially uniform thickness. The gate oxide layers 1352a, 1352b may include a high-k gate dielectric. Each of the gate oxide layers 1352a, 1352b may have a same thickness or a different thickness. The metal gate layers 1354a, 1354b may include a metal material. For example, the metal gate layers 1354a, 1354b may include titanium nitride, tantalum nitride, or aluminum nitride, as illustrative examples. Each of the metal gate layers 1354a, 1354b may include a same material or different gate layers may include different materials. The gates 3150a, 3150b may be in contact with the high mobility channels 1288a, 1288b of a channel region, respectively.

As an illustrative, non-limiting example, the gate 1350a of the first portion 341 may be a different gate (e.g., have one or more different characteristics) than the gate stack 1350b of the second portion 361. For example, a thickness of the gate oxide layer 1352a of the first portion 341 (e.g., the nMOS portion) may be a different thickness than a thickness of the gate oxide layer 1352b of the second portion 361 (e.g., the pMOS portion). As another example, a material of the metal gate layer 1354a of the first portion 341 may be a different material than a material of the metal gate layer 1354b of the second portion 361. As a further example, a width of the gate 1350a of the first portion 341 may be a different width than a width of the gate 1350b of the second portion 361. As a further example, a height of the gate 1350a of the first portion 341 may be a different height than a height of the gate 1350b of the second portion 361. For the gate 1350a and the gate 1350b to be different gates, one or more hardmasks may be applied to the first portion 341 and/or the second portion 361 to form the gate 1350a and the gate 1350b.

Figure 14A:
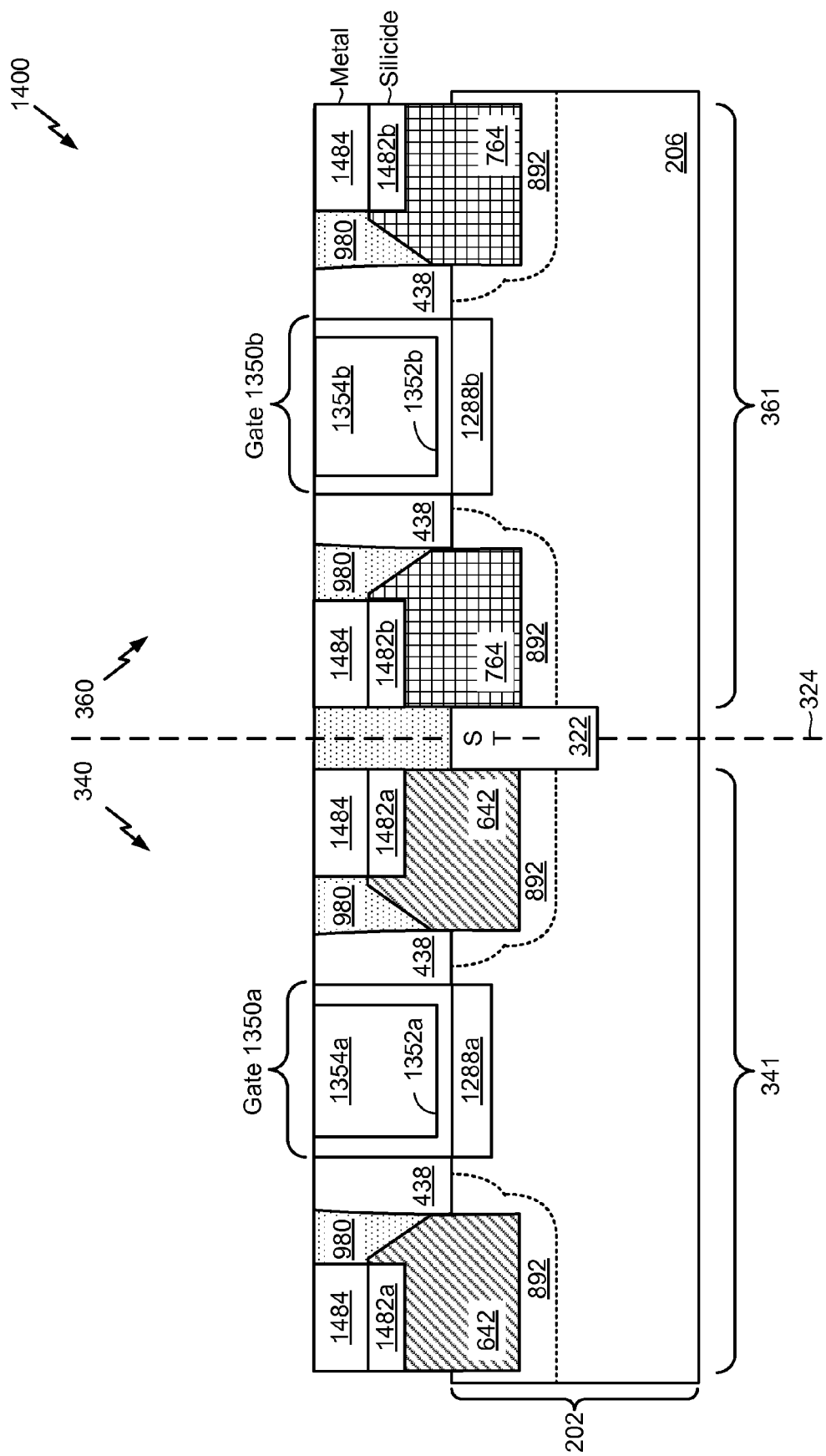
FIG. 14A is a thirteenth illustrative diagram of at least one stage of the process of fabricating the semiconductor device after forming silicides and connecting a metal to each silicide.

Referring to FIG. 14A, a thirteenth illustrative diagram of at least one stage of the process of fabricating the semiconductor device after forming silicides and connecting a metal to each silicide is depicted and generally designated 1400. Trenches may be formed in each of the source/drain regions 642 and 764. For example, the trenches may be silicide trenches into which silicide 1482a, 1482b is formed. The silicide 1482a, 1482b may include one of nickel silicide (NiSi) and/or platinum silicide (PtSi). As another example, the silicide 1482a, 1482b may be partially formed in the trenches. In a particular embodiment, the silicide 1482a, 1482b is not formed in trenches and instead is formed above an upper surface of each of the source/drain regions 642 and 744. A metal 1484 may be connected to each deposit of the silicide 1482a, 1482b. The metal 1484 may be operative to act as or be part of a source electrode or a drain electrode. In a particular embodiment, the metal 1484 includes tungsten (W). As an illustrative, non-limiting example, the silicide 1482a of the first portion 341 (e.g., an nMOS portion) may be a different material than the silicide 1482b of the second portion 361 (e.g., a pMOS portion). To form the silicide 1482a and the silicide 1482b using different materials, one or more hardmasks may be applied to the first portion 341 and/or the second portion 361 to form the silicide 1482a and the silicide 1482b.

The semiconductor device may advantageously include a high mobility channel 1288a, 1288b that enables conductivity (e.g., high current) when the semiconductor device is in an on state and may advantageously reduce (e.g., limit) current leakage via the high mobility channel 1288a, 1288b when the semiconductor device is in an off state. For example, the junction(s) 1142 between the doped region 892 and the substrate 206 may inhibit current leakage when the semiconductor device is in the off state.

Figure 14B:
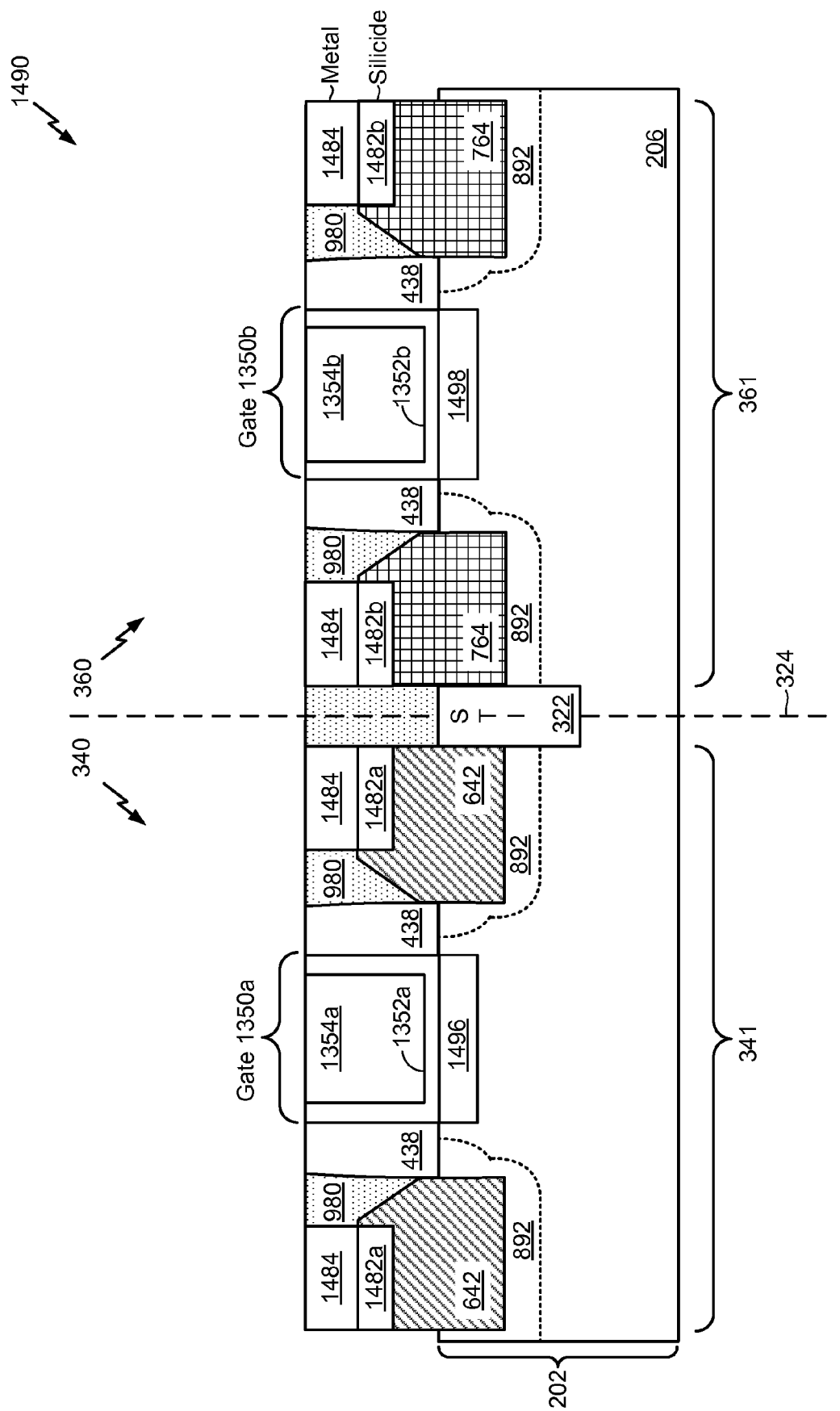
FIG. 14B is a diagram of a partial view of a semiconductor device including a high mobility channel.

Referring to FIG. 14B, a diagram of a semiconductor device including a high mobility channel is depicted and generally designated 1490. The semiconductor device 1490 may include a complementary metal-oxide-semiconductor (CMOS) device, such as a p-type metal-oxide-semiconductor (pMOS) device or an n-type metal-oxide-semiconductor (nMOS) device.

The semiconductor device 1490 may include the first area 340 and the second area 360. The first area 340, associated with the first portion 341 of the substrate 206, may be designated for a first semiconductor device, such as a first transistor, and the second area 360, associated with the second portion 361 of the substrate 206, may be designated for a second semiconductor device, such as a second transistor. As an illustrative, non-limiting example, the first semiconductor device is a p-type metal-oxide-semiconductor (pMOS) device (e.g., a p-type metal-oxide-semiconductor field effect transistor (pMOSFET) device), such as the semiconductor device 100 of FIG. 1. As another illustrative, non-limiting example, the second semiconductor device is an n-type metal-oxide-semiconductor (nMOS) device (e.g., an n-type metal-oxide-semiconductor field effect transistor (nMOSFET) device), such as the semiconductor device 100 of FIG. 1.

The first portion 341 may include a first high mobility channel 1496 and the second portion 361 may include a second high mobility channel 1498. The first high mobility channel 1496 may correspond to the high mobility channel 188 of FIG. 1 or the high mobility channel 1288a of the first portion 341 of FIGS. 12-14A. The second high mobility channel 1498 may correspond to the high mobility channel 188 of FIG. 1 or the high mobility channel 1288b of the second portion 361 of FIGS. 12-14A. The first high mobility channel 1496 and the second high mobility channel 1498 may be the same material or may be different materials. For example, the first high mobility channel 1496 and the second high mobility channel 1498 may be formed as described above with reference to FIGS. 11 and 12. Accordingly, a first thickness of the first high mobility channel 1496 and a second thickness of the second high mobility channel 1498 may be the same thickness or different thicknesses.

Figure 15:
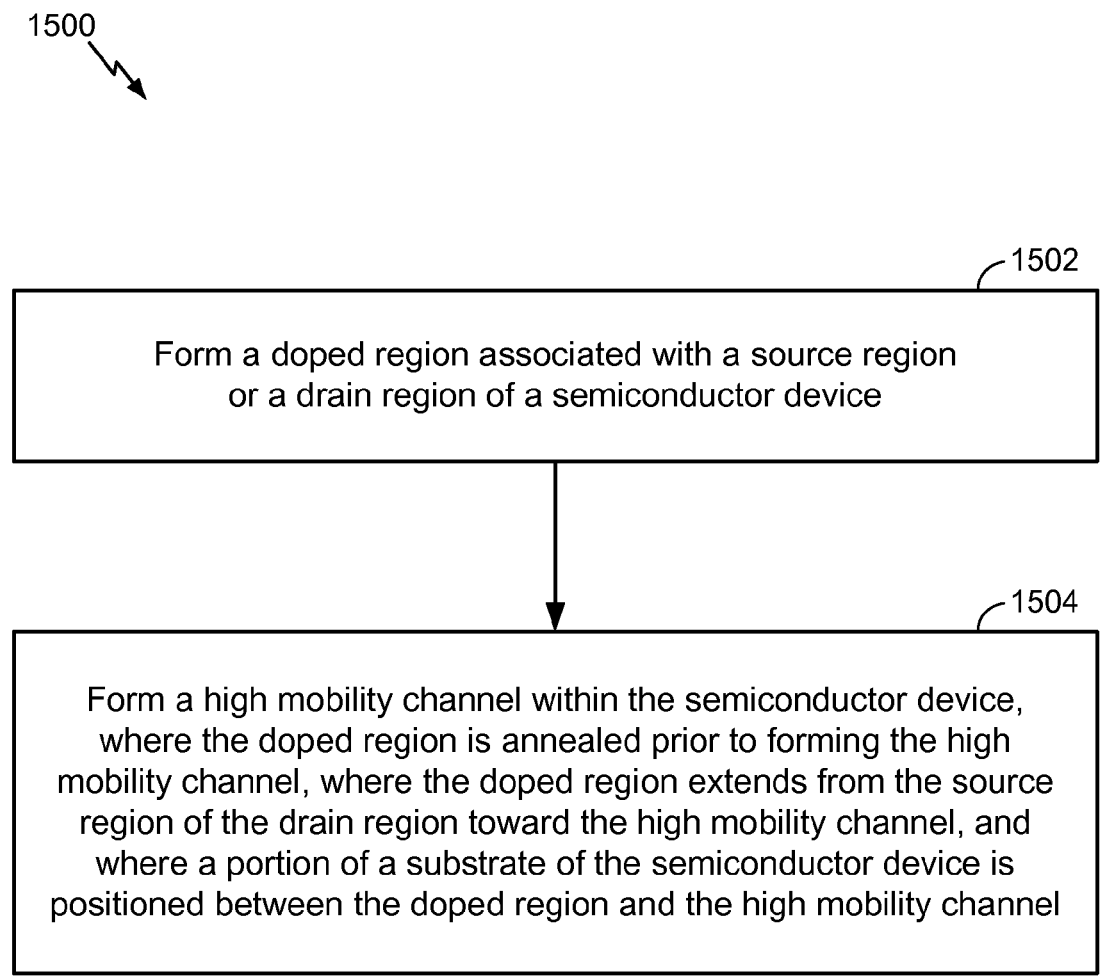
FIG. 15 is a flow diagram of a first illustrative embodiment of a method of forming a semiconductor device including a high mobility channel.

Referring to FIG. 15, a flow diagram of a first illustrative embodiment of a method 1500 of forming a semiconductor device including a high mobility channel. For example, the semiconductor device may include the semiconductor device 100 of FIG. 1, a semiconductor device formed according to the process illustrated by FIGS. 2-14A, such as a semiconductor device including the high mobility channel 1288a, 1288b, as shown in FIG. 14A, or a semiconductor device including the first high mobility channel 1496 or the second high mobility channel 1498, as shown in FIG. 14B. The method 1500 may be used as part of a CMOS process to form a first semiconductor device that is a p-type metal-oxide-semiconductor (pMOS) device and to form a second semiconductor device that is an n-type metal-oxide-semiconductor (nMOS) device.

A doped region associated with a source region or a drain region of a semiconductor device is formed, at 1502. For example, the doped region may include the doped region 192 of FIG. 1, the doped region 892 of FIG. 8, or a combination thereof. The source region or the drain region may include the source/drain region 140 of FIG. 1, the source/drain region 642 of FIG. 6, the source drain region 764 of FIG. 7, or a combination thereof. The doped region may be annealed to form junctions, such as the junctions 142 of FIG. 1 or the junctions 842 of FIG. 8.

The method 1500 further includes forming a high mobility channel within the semiconductor device, where the doped region is annealed prior to forming the high mobility channel, where the doped region extends from the source region or the drain region toward the high mobility channel, and where a portion of a substrate of the semiconductor device is positioned between the doped region and the high mobility channel, at 1504. The high mobility channel may include the high mobility channel 188 of FIG. 1 or the high mobility channel 1288a, 1288b of FIG. 12. The substrate may include the substrate 106 of FIG. 1 or the substrate 206 of FIG. 2. The substrate may be part of a wafer, such as the wafer 202 of FIG. 2, that includes a silicon on insulator (SOI) structure, a silicon on silicon (SOS) structure, or a bulk silicon structure.

In a particular embodiment, a complementary metal-oxide-semiconductor (CMOS) process may be performed on a wafer to form the semiconductor device. The CMOS process may include forming the doped region, at 1502, and forming the high mobility channel, 1504.

The method of FIG. 15 may enable formation of a semiconductor device that is able to have reduced current leakage via the high mobility channel when the semiconductor device is in an off state.

Figure 16:
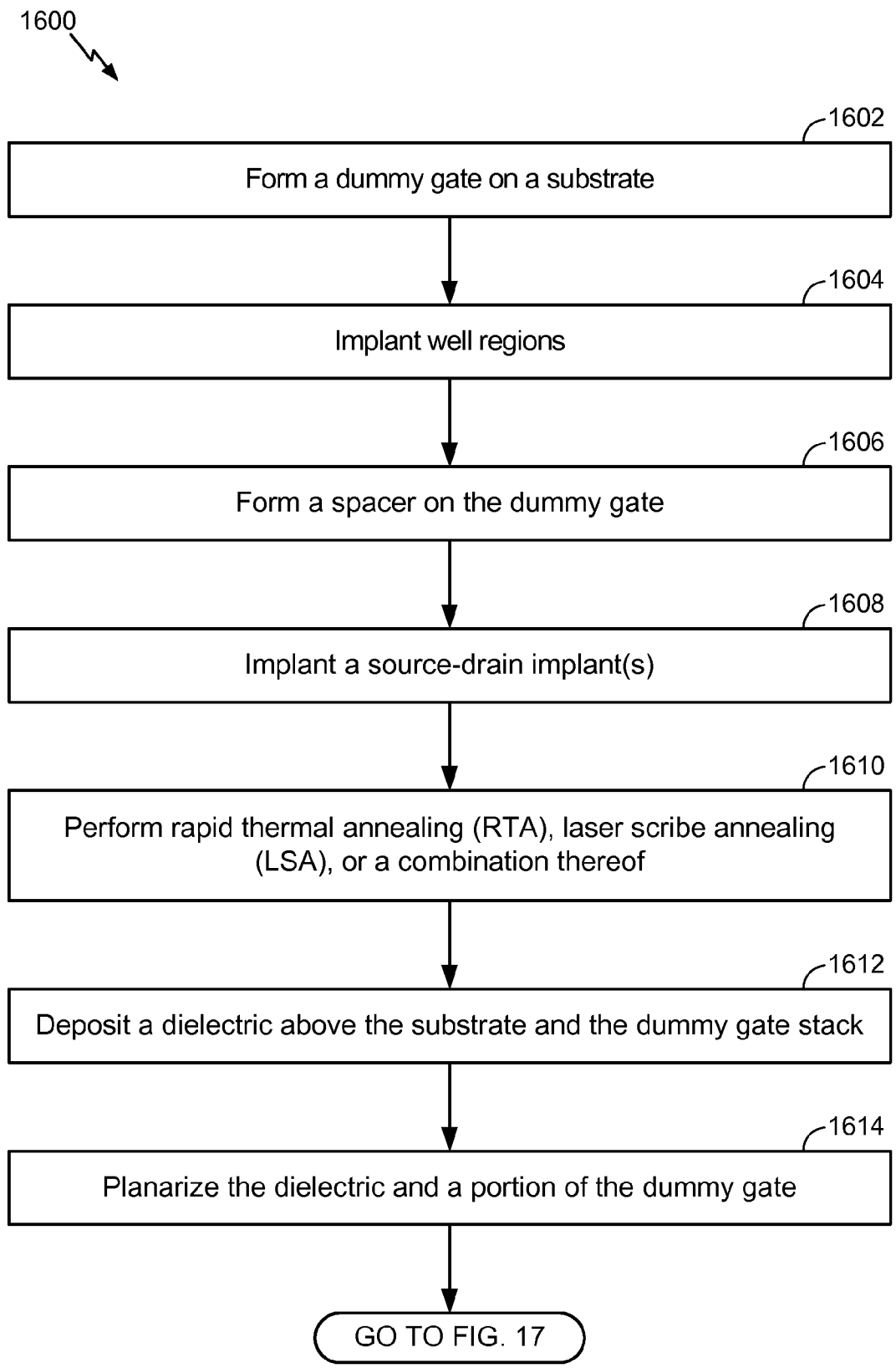
FIG. 16 is a flow diagram of a first portion of a second illustrative embodiment of a method of forming a semiconductor device including a high mobility channel.

FIG. 16 is a flow diagram of a first portion 1600 of a second illustrative embodiment of a method of forming a semiconductor device including a high mobility channel. For example, the semiconductor device may include the semiconductor device 100 of FIG. 1, a semiconductor device formed according to the process illustrated by FIGS. 2-14A, such as a semiconductor device including the high mobility channel 1288a, 1288b, as shown in FIG. 14A, a semiconductor device including the high mobility channel 1496 or the high mobility channel 1498, as shown in FIG. 14B, or a semiconductor device formed according to the process illustrated by FIGS. 2-14A using the method of FIG. 15, or a combination thereof. The method 1600 may be used as part of a CMOS process to form a first semiconductor device that is a p-type metal-oxide-semiconductor (pMOS) device and to form a second semiconductor device of a second type that is an n-type metal-oxide-semiconductor (nMOS) device.

A dummy gate may be formed on a substrate at 1602. The substrate may be included in the semiconductor device. For example, the dummy gate (e.g., a dummy gate stack) may include the gate stack 330 of FIG. 3.

Well regions may be implanted, at 1604, and a spacer may be formed on the dummy gate, at 1606. The well regions may include the implants 310 of FIG. 3. The spacer may include the spacer 138 of FIG. 1, the spacer 438 of FIG. 4, or a combination thereof.

A source/drain implant(s) may be implanted, at 1608. For example, a source implant associated with a source region may be deposited and a drain implant associated with a drain region may be deposited. The source drain implant(s) may include the source/drain region 140 of FIG. 1, the source/drain region 642 of FIG. 6, the source drain region 764 of FIG. 7, or a combination thereof. For example, the source/drain implant(s) may include silicon (Si), silicon carbon (Si:C), or another material that increases an n-type metal-oxide-semiconductor (nMOS) channel mobility. As another example, the source/drain implant(s) may include silicon germanium (SiGe) or another material that increases a p-type metal-oxide-semiconductor (pMOS) channel mobility). The source/drain implants may doped during deposition, such as epitaxially depositing the source/drain implants using in-situ doping, or may be doped using doping implants, such as the doping implants 890 of FIG. 8, after formation of the source/drain implants.

Rapid thermal annealing (RTA), laser scribe annealing (LSA), or a combination thereof may be performed, at 1610. RTA, LSA, or a combination thereof may be performed after a doped region, such as the doped region 192 of FIG. 1 or the doped region 892 of FIG. 8, is formed. For example, RTA, LSA, or a combination thereof may also be performed to form junctions, such as the junctions 142 of FIG. 1 or the junctions 842 of FIG. 8, to diffuse source/drain dopants of the source/drain implant(s), and/or to densify the spacer.

A dielectric may be deposited above the substrate and the dummy gate, at 1612, and the dielectric and a portion of the dummy gate may be planarized, at 1614. For example, the dielectric may include the dielectric material 180 of FIG. 1 or the dielectric material 980 of FIG. 9.

Figure 17:
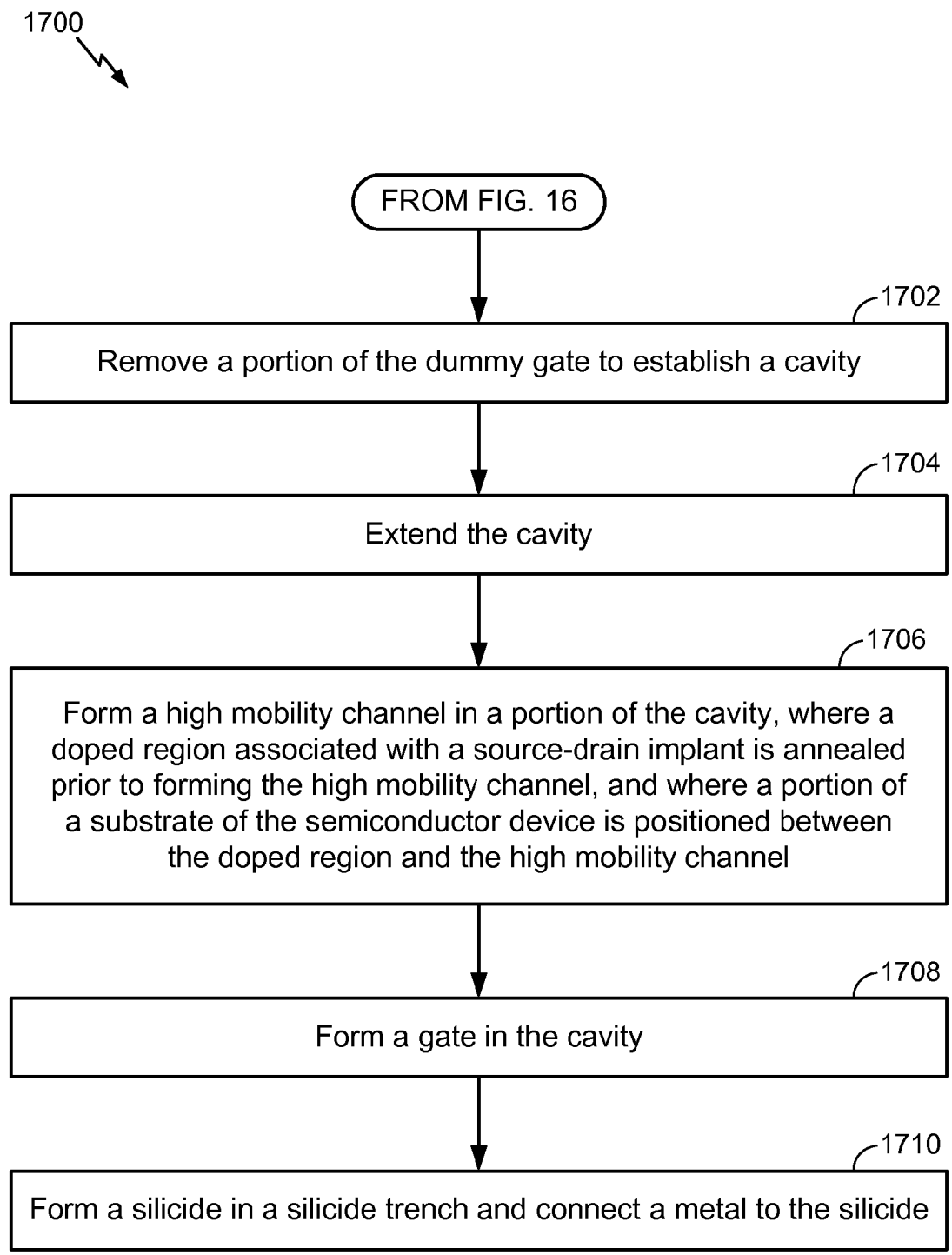
FIG. 17 is a flow diagram of a second portion of the method of FIG. 16.

FIG. 17 is a flow diagram of a second portion 1700 of the second illustrative embodiment of the method of FIG. 16. The method 1700 may be used as part of a CMOS process to form a first semiconductor device that is a p-type metal-oxide-semiconductor (pMOS) device and to form a second semiconductor device that is an n-type metal-oxide-semiconductor (nMOS) device.

In the second portion 1600 of the third illustrative embodiment, a portion of the dummy gate may be removed to establish a cavity, at 1702. To establish the cavity, a gate electrode layer of the dummy gate includes amorphous silicon (a:Si) which is removed. For example, the gate electrode layer 332 may be removed from the gate stack 330 to create the cavity 1072 of FIG. 10. Additionally or alternatively, a capping layer of the gate stack may be removed prior to or in conjunction with removing the gate electrode layer. For example, a capping layer 334 of the gate stack 330 of FIG. 3 may be removed prior to or in conjunction with removing the gate electrode layer 332 from of the gate stack 330 to establish the cavity 1072. For example, the capping layer 334 may be removed as part of planarization of the dummy gate, at 1614.

The cavity may be extended, at 1704. For example, the cavity may be extended into a channel region of the semiconductor device. For example, the cavity 1072 of FIG. 10 may each be extended as shown in FIG. 11. In a particular embodiment, a portion of the substrate, such as the substrate 106 of FIG. 1 or the substrate 206 of FIG. 2, is removed to extend the cavity.

A high mobility channel may be formed in a portion of the cavity, where a doped region associated with a source/drain implant is annealed prior to forming the high mobility channel, and where a portion of a substrate of the semiconductor device is positioned between the doped region and the high mobility channel, at 1706. For example, a portion of the substrate, such as the substrate 106 of FIG. 1 or the substrate 206 of FIG. 2 may be filled with a high mobility material to form the high mobility channel. The high mobility channel may include the high mobility channel 188 of FIG. 1, the high mobility channel 1288a, 1288b of FIG. 12, the high mobility channel 1496, or the high mobility channel 1498 of FIG. 14B. The doped region, such as the doped region 192 of FIG. 1 or the doped region 892 of FIG. 8, may be annealed, at 1610, prior to high mobility channel being formed, at 1706.

A gate may be formed on the cavity, at 1708. The gate may be coupled to the high mobility channel. The gate, such as the gate 150 of FIG. 1 or the gate 1350a, 1350b of FIG. 13, may be formed in the cavity 1072 of FIGS. 10-12. The gate may include a high K material and a metal. The high mobility channel is formed using an epitaxial growth.

A silicide may be formed in a silicide trench and connected to a metal, at 1710. For example, trenches may be formed in each of the source/drain regions 140 of FIG. 1, the source/drain regions 642 of FIG. 6, the source/drain regions 764 of FIG. 7, or a combination thereof. The silicide and the metal may be included in the silicide 182 and the metal 184 of FIG. 1 or the silicide 1482a, 1482b and the metal 1484 of FIGS. 14A-B.

The method illustrated by FIGS. 16 and 17 may enable formation of a semiconductor device that enables conductivity (e.g., high current) when the semiconductor device is in an on state and reduces current leakage via the high mobility channel when the semiconductor device is in an off state.

The methods of FIGS. 15-17 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the methods of FIG. 15-17 can be performed by one or more processors that execute instructions.

Figure 18:
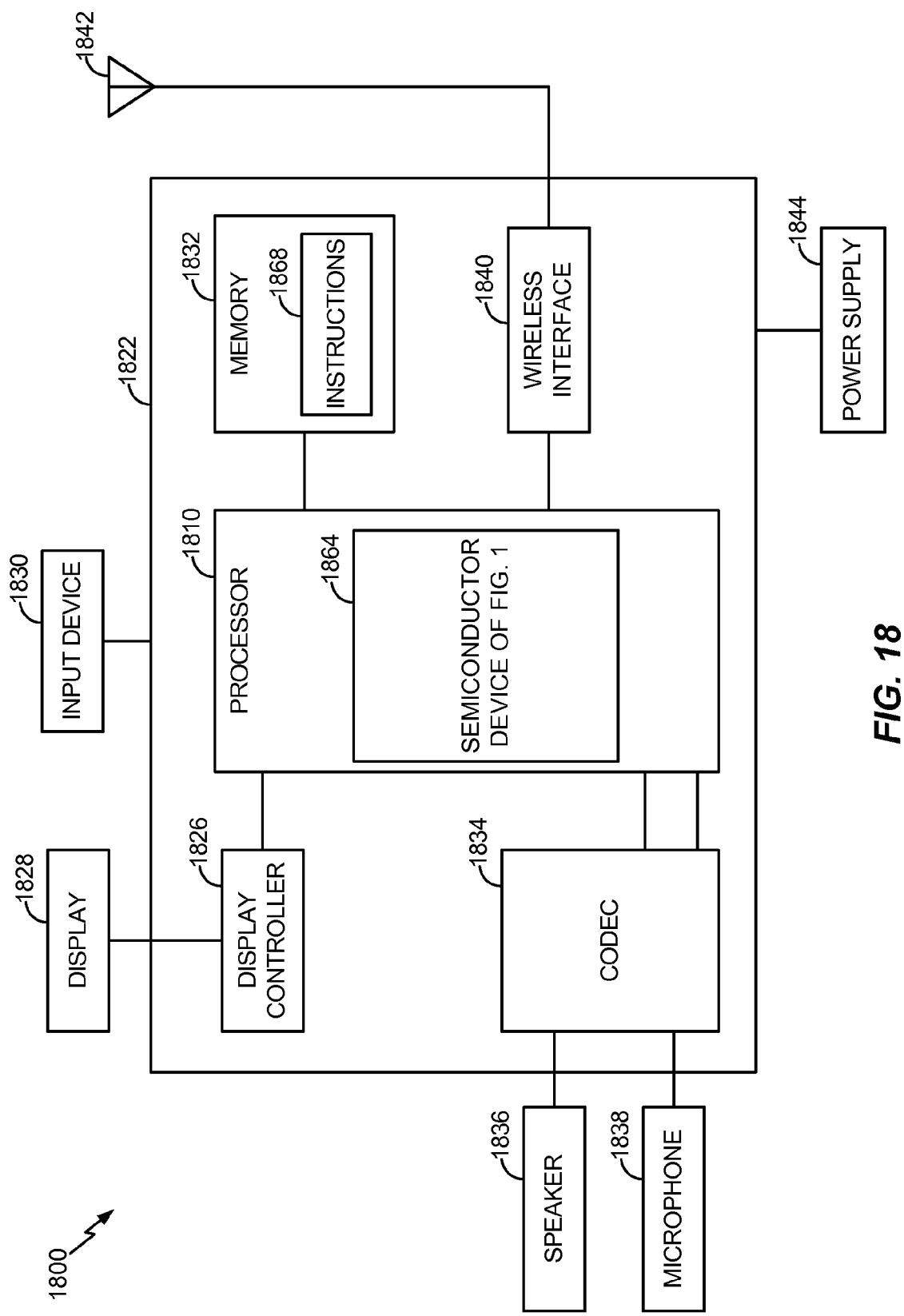
FIG. 18 is a block diagram of a device including the semiconductor device of FIG. 1.

Referring to FIG. 18, a block diagram of a particular illustrative embodiment of a wireless communication device 1800 is depicted. The device 1800 may include the semiconductor device 100 of FIG. 1, a semiconductor device formed according to the process illustrated by FIGS. 2-14 using at least one of the methods of FIGS. 15-17, or a combination thereof.

The device 1800 includes a processor 1810, such as a digital signal processor (DSP), coupled to a memory 1832. The processor 1810 may include a semiconductor device 1864. For example, the semiconductor device 1864 may be the semiconductor device 100 of FIG. 1, a semiconductor device formed according to the process illustrated by FIGS. 2-14 using at least one of the methods of FIGS. 15-17, or a combination thereof.

The memory 1832 includes instructions 1868 (e.g., executable instructions) such as computer-readable instructions or processor-readable instructions. The instructions 1868 may include one or more instructions that are executable by a computer, such as the processor 1810.

FIG. 18 also shows a display controller 1826 that is coupled to the processor 1810 and to a display 1828. A coder/decoder (CODEC) 1834 can also be coupled to the processor 1810. A speaker 1836 and a microphone 1838 can be coupled to the CODEC 1834.

FIG. 18 also indicates that a wireless interface 1840, such as a wireless controller, can be coupled to the processor 1810 and to an antenna 1842. In a particular embodiment, the processor 1810, the display controller 1826, the memory 1832, the CODEC 1834, and the wireless interface 1840 are included in a system-in-package or system-on-chip device 1822. In a particular embodiment, an input device 1830 and a power supply 1844 are coupled to the system-on-chip device 1822. Moreover, in a particular embodiment, as illustrated in FIG. 18, the display 1828, the input device 1830, the speaker 1836, the microphone 1838, the antenna 1842, and the power supply 1844 are external to the system-on-chip device 1822. However, each of the display 1828, the input device 1830, the speaker 1836, the microphone 1838, the antenna 1842, and the power supply 1844 can be coupled to a component of the system-on-chip device 1822, such as an interface or a controller. Although the semiconductor device 1864 is depicted as being included in the processor 1810, the semiconductor device may be included in another component of the device 1800 or a component coupled to the device 1800. For example, the semiconductor device 1864 may be included in the memory 1832, the wireless interface 1840, the power supply 1844, the input device 1830, the display 1828, the display controller 1826, the CODEC 1834, the speaker 1836, or the microphone 1838.

In conjunction with one or more of the described embodiments of FIGS. 1-18, an apparatus is disclosed that may include channel means for enabling a high-mobility carrier path between a source region and a drain region when a semiconductor device is in an on state. The channel means for enabling the high-mobility carrier path extends substantially a length of a gate of the semiconductor device. The channel means for enabling the high-mobility carrier path may correspond to the high mobility channel 188 of FIG. 1, the high mobility channel 1288a, 1288b of FIG. 12, the high mobility channel 1496 or the high mobility channel 1498 of FIG. 14B, one or more other devices or circuits configured to enable the high-mobility carrier path, or any combination thereof.

The apparatus may also include means for enabling current between the channel means for enabling the high-mobility carrier path and a doped region associated with one of the source region or the drain region. The means for enabling current is positioned between the doped region and the channel means for enabling the high-mobility carrier path. The means for enabling current may correspond to the substrate 106 of FIG. 1, the substrate 206 of FIG. 2, one or more other devices or circuits configured to enable current between the channel means for enabling the high mobility carrier path and the doped region, or any combination thereof.

In conjunction with the described embodiments of FIGS. 1-18, a method is disclosed that may include a first step for forming a doped region associated with a source region or a drain region of a semiconductor device, such as described in the method 1500 of FIG. 15 at 502, the first portion 1600 of the method of FIG. 16 at 1608, during epitaxial deposition of source/drain implants using in-situ doping, using doping implants after formation of source/drain implants, one or more other processes configured to form the doped region associated with the source region or the drain region of the semiconductor device, or any combination thereof.

The method may also include a second step for forming a high mobility channel within the semiconductor device. The doped region is annealed prior to forming the high mobility channel and extends from the source region or the drain region toward the high mobility channel. A portion of a substrate of the semiconductor device is positioned between the doped region and the high mobility channel. The second step for forming the high mobility channel within the semiconductor device may be performed as described in the method 1500 of FIG. 15 at 1504, the second portion 1700 of the method of FIG. 17 at 1706, by depositing a high mobility channel material in at least a cavity, by epitaxial growing a high mobility material in a cavity, one or more other processes configured to form the high mobility channel within the semiconductor device, or any combination thereof.

One or more of the disclosed embodiments may be implemented in a system or an apparatus, such as the device 1800, that may include a communications device, a fixed location data unit, a mobile location data unit, a mobile phone, a cellular phone, a satellite phone, a computer, a tablet, a portable computer, or a desktop computer. Additionally, the device 1800 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof. As another illustrative, non-limiting example, the system or the apparatus may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof.

Figure 19:
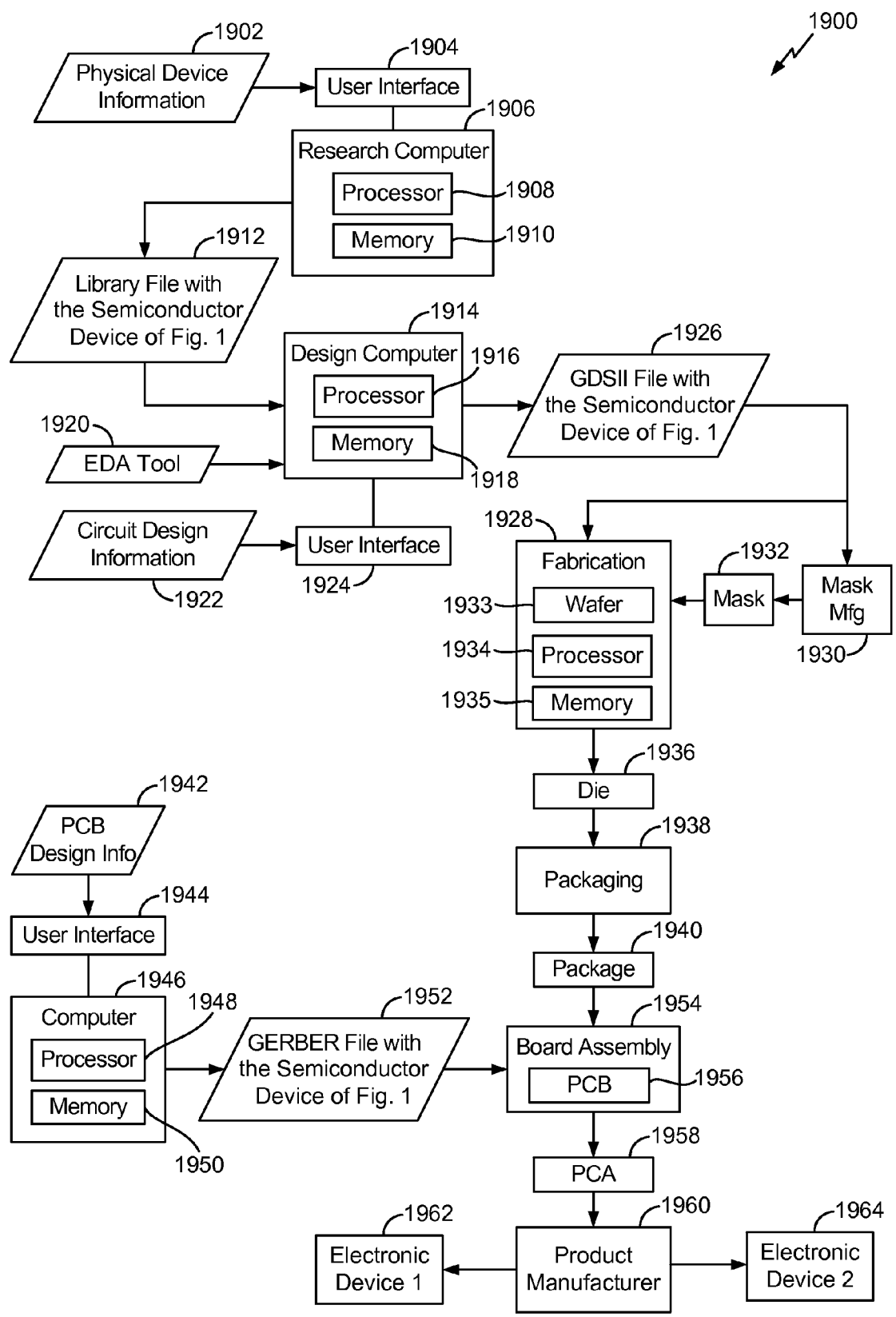
FIG. 19 is a data flow diagram of an illustrative embodiment of a manufacturing process to fabricate a device including the semiconductor device of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 19 depicts a particular illustrative embodiment of an electronic device manufacturing process 1900.

Physical device information 1902 is received at the manufacturing process 1900, such as at a research computer 1906. The physical device information 1902 may include design information representing at least one physical property of a semiconductor device, such as the semiconductor device 100 of FIG. 1, a semiconductor device formed according to the process illustrated by FIGS. 2-14 using at least one of the methods of FIGS. 15-17, or a combination thereof. For example, the physical device information 1902 may include physical parameters, material characteristics, and structure information that is entered via a user interface 1904 coupled to the research computer 1906. The research computer 1906 includes a processor 1908, such as one or more processing cores, coupled to a computer readable medium (e.g., a non-transitory computer readable medium), such as a memory 1910. The memory 1910 may store computer readable instructions that are executable to cause the processor 1908 to transform the physical device information 1902 to comply with a file format and to generate a library file 1912.

In a particular embodiment, the library file 1912 includes at least one data file including the transformed design information. For example, the library file 1912 may include a library of semiconductor devices including a device that includes the semiconductor device 100 of FIG. 1, a semiconductor device formed according to the process illustrated by FIGS. 2-14 using at least one of the methods of FIGS. 15-17, or a combination thereof, that is provided for use with an electronic design automation (EDA) tool 1920.

The library file 1912 may be used in conjunction with the EDA tool 1920 at a design computer 1914 including a processor 1916, such as one or more processing cores, coupled to a memory 1918. The EDA tool 1920 may be stored as processor executable instructions at the memory 1918 to enable a user of the design computer 1914 to design a circuit including the semiconductor device 100 of FIG. 1, a semiconductor device formed according to the process illustrated by FIGS. 2-14 using at least one of the methods of FIGS. 15-17, or a combination thereof, of the library file 1912. For example, a user of the design computer 1914 may enter circuit design information 1922 via a user interface 1924 coupled to the design computer 1914. The circuit design information 1922 may include design information representing at least one physical property of a semiconductor device, such as the semiconductor device 100 of FIG. 1, a semiconductor device formed according to the process illustrated by FIGS. 2-14 using at least one of the methods of FIGS. 15-17, or a combination thereof. To illustrate, the circuit design property may include identification of particular circuits and relationships to other elements in a circuit design, positioning information, feature size information, interconnection information, or other information representing a physical property of a semiconductor device.

The design computer 1914 may be configured to transform the design information, including the circuit design information 1922, to comply with a file format. To illustrate, the file formation may include a database binary file format representing planar geometric shapes, text labels, and other information about a circuit layout in a hierarchical format, such as a Graphic Data System (GDSII) file format. The design computer 1914 may be configured to generate a data file including the transformed design information, such as a GDSII file 1926 that includes information describing the semiconductor device 100 of FIG. 1, a semiconductor device formed according to the process illustrated by FIGS. 2-14 using at least one of the methods of FIGS. 15-17, or a combination thereof, in addition to other circuits or information. To illustrate, the data file may include information corresponding to a system-on-chip (SOC) that includes the semiconductor device 100 of FIG. 1, a semiconductor device formed according to the process illustrated by FIGS. 2-14 using at least one of the methods of FIGS. 15-17, or a combination thereof, and that also includes additional electronic circuits and components within the SOC.

The GDSII file 1926 may be received at a fabrication process 1928 to manufacture the semiconductor device 100 of FIG. 1, a semiconductor device formed according to the process illustrated by FIGS. 2-14 using at least one of the methods of FIGS. 15-17, or a combination thereof, according to transformed information in the GDSII file 1926. For example, a device manufacture process may include providing the GDSII file 1926 to a mask manufacturer 1930 to create one or more masks, such as masks to be used with photolithography processing, illustrated as a representative mask 1932. The mask 1932 may be used during the fabrication process to generate one or more wafers 1933, which may be tested and separated into dies, such as a representative die 1936. The die 1936 includes a circuit including a device that includes the semiconductor device 100 of FIG. 1, a semiconductor device formed according to the process illustrated by FIGS. 2-14 using at least one of the methods of FIGS. 15-17, or a combination thereof.

For example, the fabrication process 1928 may include a processor 1934 and a memory 1935 to initiate and/or control the fabrication process 1928. The memory 1935 may include executable instructions such as computer-readable instructions or processor-readable instructions. The executable instructions may include one or more instructions that are executable by a computer such as the processor 1934.

The fabrication process 1928 may be implemented by a fabrication system that is fully automated or partially automated. For example, the fabrication process 1928 may be automated according to a schedule. The fabrication system may include fabrication equipment (e.g., processing tools) to perform one or more operations to form a semiconductor device. For example, the fabrication equipment may be configured to deposit one or more materials, apply doping implants, apply an etching mask, perform etching, perform annealing, perform planarization, form a gate stack, etc.

The fabrication system (e.g., an automated system that performs the fabrication process 1928) may have a distributed architecture (e.g., a hierarchy). For example, the fabrication system may include one or more processors, such as the processor 1934, one or more memories, such as the memory 1935, and/or controllers that are distributed according to the distributed architecture. The distributed architecture may include a high-level processor that controls or initiates operations of one or more low-level systems. For example, a high-level portion of the fabrication process 1928 may include one or more processors, such as the processor 1934, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 1934.

Alternatively, the processor 1934 may be a part of a high-level system, subsystem, or component of the fabrication system. In another embodiment, the processor 1934 includes distributed processing at various levels and components of a fabrication system.

Thus, the processor 1934 may include processor-executable instructions that, when executed by the processor 1934, cause the processor 1934 to initiate or control formation of a semiconductor device, the semiconductor device formed by forming a doped region associated with a source region or a drain region of a semiconductor device and forming a high mobility channel within the semiconductor device. For example, the doped region may be formed by one or more doping tools, such as an ion implantation tool or a spin-on deposition tool. As another example, the high mobility channel may be formed by one or more deposition tools, such as a molecular beam epitaxial growth tool, a flowable chemical vapor deposition (FCVD) tool, or a spin-on deposition tool. The doped region is annealed prior to forming the high mobility channel, the doped region extends from the source region or the drain region toward the high mobility channel, and a portion of a substrate of the semiconductor device is positioned between the doped region and the high mobility channel.

The executable instructions included in the memory 1935 may enable the processor 1934 to initiate formation of a semiconductor device such as the semiconductor device 100 of FIG. 1, a semiconductor device formed according to the process illustrated by FIGS. 2-14 using at least one of the methods of FIGS. 15-17, or a combination thereof. In a particular embodiment, the memory 1935 is a non-transient computer readable medium storing computer-executable instructions that are executable by the processor 1934 to cause the processor 1934 to initiate formation of a semiconductor device, such as a complementary metal-oxide-semiconductor (CMOS) device, in accordance with at least a portion of any of the method 1500 of FIG. 15, the method 1600 of FIG. 16, the method 1700 of FIG. 17, or any combination thereof. For example, the computer executable instructions may be executable to cause the processor 1934 to initiate formation of the semiconductor device. The semiconductor device may be formed by forming a doped region associated with a source region or a drain region of a semiconductor device and by forming a high mobility channel within the semiconductor device. The doped region is annealed prior to forming the high mobility channel and the doped region extends from the source region or the drain region toward the high mobility channel. A portion of a substrate of the semiconductor device is positioned between the doped region and the high mobility channel.

As an illustrative example, the processor 1934 may initiate or control a first step for forming a doped region associated with a source region or a drain region of a semiconductor device. For example, the processor 1934 may be embedded in or coupled to one or more controllers that control one or more pieces of fabrication equipment to perform the first step for forming the doped region associated with the source region or the drain region of the semiconductor device. The processor 1934 may control the first step for forming the doped region associated with the source region or the drain region of a semiconductor device by controlling one or more processes as described in the method 1500 of FIG. 15 at 502 or as described in the first portion 1600 of the method of FIG. 16 at 1608, by controlling an epitaxial deposition of source/drain implants using in-situ doping, by controlling use of doping implants after formation of source/drain implants, by controlling one or more other processes configured to form the doped region associated with the source region or the drain region of the semiconductor device, or any combination thereof.

The processor 1934 may also control a second step for forming a high mobility channel within the semiconductor device. For example, the processor 1934 may be embedded in or coupled to one or more controllers that control one or more pieces of fabrication equipment to perform the second step for forming the high mobility channel within the semiconductor device. The doped region is annealed prior to forming the high mobility channel and extends from the source region or the drain region toward the high mobility channel. A portion of a substrate of the semiconductor device is positioned between the doped region and the high mobility channel. The processor 1934 may control the second step for forming the high mobility channel within the semiconductor device by controlling one or more processes as described in the method 1500 of FIG. 15 at 1504 or as described in the second portion 1700 of the method of FIG. 17 at 1706, by controlling a deposition of a high mobility channel material in at least a cavity, by controlling an epitaxial growth of a high mobility material in a cavity, one or more other processes configured to form the high mobility channel within the semiconductor device, or any combination thereof.

The die 1936 may be provided to a packaging process 1938 where the die 1936 is incorporated into a representative package 1940. For example, the package 1940 may include the single die 1936 or multiple dies, such as a system-in-package (SiP) arrangement. The package 1940 may be configured to conform to one or more standards or specifications, such as Joint Electron Device Engineering Council (JEDEC) standards.

Information regarding the package 1940 may be distributed to various product designers, such as via a component library stored at a computer 1946. The computer 1946 may include a processor 1948, such as one or more processing cores, coupled to a memory 1950. A printed circuit board (PCB) tool may be stored as processor executable instructions at the memory 1950 to process PCB design information 1942 received from a user of the computer 1946 via a user interface 1944. The PCB design information 1942 may include physical positioning information of a packaged semiconductor device on a circuit board, the packaged semiconductor device corresponding to the package 1940 including the semiconductor device 100 of FIG. 1, a semiconductor device formed according to the process illustrated by FIGS. 2-14 using at least one of the methods of FIGS. 15-17, or a combination thereof.

The computer 1946 may be configured to transform the PCB design information 1942 to generate a data file, such as a GERBER file 1952 with data that includes physical positioning information of a packaged semiconductor device on a circuit board, as well as layout of electrical connections such as traces and vias, where the packaged semiconductor device corresponds to the package 1940 including the semiconductor device 100 of FIG. 1, a semiconductor device formed according to the process illustrated by FIGS. 2-14 using at least one of the methods of FIGS. 15-17, or a combination thereof. In other embodiments, the data file generated by the transformed PCB design information may have a format other than a GERBER format.

The GERBER file 1952 may be received at a board assembly process 1954 and used to create PCBs, such as a representative PCB 1956, manufactured in accordance with the design information stored within the GERBER file 1952. For example, the GERBER file 1952 may be uploaded to one or more machines to perform various steps of a PCB production process. The PCB 1956 may be populated with electronic components including the package 1940 to form a representative printed circuit assembly (PCA) 1958.

The PCA 1958 may be received at a product manufacture process 1960 and integrated into one or more electronic devices, such as a first representative electronic device 1962 and a second representative electronic device 1964. As an illustrative, non-limiting example, the first representative electronic device 1962, the second representative electronic device 1964, or both, may include a communications device, a fixed location data unit, a mobile location data unit, a mobile phone, a cellular phone, a satellite phone, a computer, a tablet, a portable computer, or a desktop computer. Additionally, the device 1800 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the semiconductor device 100 of FIG. 1, a semiconductor device formed according to the process illustrated by FIGS. 2-14 using at least one of the methods of FIGS. 15-17, or a combination thereof, is integrated. As another illustrative, non-limiting example, one or more of the electronic devices 1962 and 1964 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 19 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor device 100 of FIG. 1, a semiconductor device formed according to the process illustrated by FIGS. 2-14 using at least one of the methods of FIGS. 15-17, or a combination thereof, may be fabricated, processed, and incorporated into an electronic device, as described in the illustrative process 1900. One or more aspects of the embodiments disclosed with respect to FIGS. 1-18 may be included at various processing stages, such as within the library file 1912, the GDSII file 1926, and the GERBER file 1952, as well as stored at the memory 1910 of the research computer 1906, the memory 1918 of the design computer 1914, the memory 1950 of the computer 1946, the memory of one or more other computers or processors (not shown) used at the various stages, such as at the board assembly process 1954, and also incorporated into one or more other physical embodiments such as the mask 1932, the die 1936, the package 1940, the PCA 1958, other products such as prototype circuits or devices (not shown), or any combination thereof. Although various representative stages of production from a physical device design to a final product are depicted, in other embodiments fewer stages may be used or additional stages may be included. Similarly, the process 1900 may be performed by a single entity or by one or more entities performing various stages of the process 1900.

Although one or more of FIGS. 1-19 may illustrate systems, apparatuses, and/or methods according to the teachings of the disclosure, the disclosure is not limited to these illustrated systems, apparatuses, and/or methods. Embodiments of the disclosure may be suitably employed in any device that includes integrated circuitry including memory, a processor, and on-chip circuitry.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A semiconductor device comprising:
 a high mobility channel between a source region and a drain region, wherein the high mobility channel extends substantially a length of a gate; and
 a doped region extending from the source region or the drain region toward the high mobility channel, wherein an undoped portion of a substrate separates the doped region and the high mobility channel.

2. The semiconductor device of claim 1, wherein the doped region extends from the source region toward the high mobility channel.

3. The semiconductor device of claim 1, wherein the doped region extends from the drain region toward the high mobility channel.

4. The semiconductor device of claim 1, further comprising the gate, wherein the high mobility channel is coupled to the gate.

5. The semiconductor device of claim 4, further comprising a spacer coupled to the gate, wherein the doped region is in contact with the spacer.

6. The semiconductor device of claim 1, wherein the doped region is in contact with the source region or the drain region, and wherein the doped region is in contact with the undoped portion of the substrate and a spacer.

7. The semiconductor device of claim 1, wherein a junction between the doped region and the source region or the drain region enables a high-mobility carrier path from the source region to the drain region in an on state.

8. The semiconductor device of claim 1, wherein a junction between the doped region and the high mobility channel provides a barrier to inhibit current leakage in an off state.

9. The semiconductor device of claim 1, wherein the undoped portion of the substrate is in contact with a spacer, and wherein the substrate includes silicon.

10. The semiconductor device of claim 1, wherein the doped region does not extend under the gate.

11. The semiconductor device of claim 1, wherein the high mobility channel does not extend under a spacer.

12. The semiconductor device of claim 1, wherein at least a portion of a junction between the undoped portion of the substrate and the doped region is positioned below a spacer.

13. The semiconductor device of claim 1, wherein the high mobility channel and the doped region are integrated in at least one semiconductor die.

14. The semiconductor device of claim 1, wherein the high mobility channel and the doped region are integrated into a mobile phone, a cellular phone, a portable computer, a radio, a satellite radio, a communication device, a portable music player, a portable digital video player, a navigation device, a personal digital assistant (PDA), a mobile location data unit, or a combination thereof.

15. The semiconductor device of claim 1, wherein the high mobility channel and the doped region are integrated into a set top box, an entertainment unit, a fixed location data unit, a desktop computer, a monitor, a computer monitor, a television, a tuner, a music player, a digital music player, a video player, a digital video player, a digital video disc (DVD) player, or a combination thereof.

16. The semiconductor device of claim 1, further comprising a silicide in contact with the source region or the drain region, wherein the source region or the drain region is between the silicide and a first portion of the doped region.

17. The semiconductor device of claim 1, further comprising a shallow trench isolation (STI) region, wherein the doped region is in contact with the STI region.

18. The semiconductor device of claim 1, wherein the doped region is physically isolated from the high mobility channel.

19. The semiconductor device of claim 1, wherein a portion of the doped region is below the source region or the drain region.

20. The semiconductor device of claim 1, wherein the high mobility channel includes germanium (Ge), a III-V material, a II-VI material, graphene, another high mobility material, or a combination thereof.

21. The semiconductor device of claim 1, wherein the source region and the drain region include silicon germanium (SiGe), embedded silicon (e-Si), or embedded silicon carbon (e-Si:C).

22. The semiconductor device of claim 1, wherein the doped region includes an n-type dopant or a p-type dopant.

23. The semiconductor device of claim 1, wherein the gate comprises a high K material.

24. The semiconductor device of claim 1, further comprising the substrate including the doped region, a second doped region, and the undoped portion of the substrate, wherein the doped region extends from the source region toward the high mobility channel, and wherein the second doped region extends from the drain region toward the high mobility channel.

25. An apparatus comprising:
channel means for enabling a high-mobility carrier path between a source region and a drain region when a semiconductor device is in an on state, wherein the channel means for enabling the high-mobility carrier path extends substantially a length of a gate of the semiconductor device; and
means for inhibiting current leakage between the channel means for enabling the high-mobility carrier path and a doped region associated with one of the source region or the drain region, wherein the means for inhibiting current leakage separates the doped region and the channel means for enabling the high-mobility carrier path.

26. The apparatus of claim 25, wherein the channel means comprises a high mobility channel, and wherein the high mobility channel and the doped region are integrated in at least one semiconductor die.

27. The apparatus of claim 26, wherein the high mobility channel includes germanium (Ge), a III-V material, a II-VI material, graphene, another high mobility material, or a combination thereof.

28. The apparatus of claim 25, wherein the means for inhibiting current leakage comprises a substrate material.

29. The apparatus of claim 25, wherein the means for inhibiting current leakage is configured to provide a barrier to inhibit current leakage when the semiconductor device is in an off state.

30. The apparatus of claim 25, wherein the channel means for enabling the high-mobility carrier path and the means for inhibiting current leakage are integrated into a mobile phone, a cellular phone, a portable computer, a radio, a satellite radio, a communication device, a portable music player, a portable digital video player, a navigation device, a personal digital assistant (PDA), a mobile location data unit, or a combination thereof.

31. The apparatus of claim 25, wherein the channel means for enabling the high-mobility carrier path and the means for inhibiting current leakage are integrated into a set top box, an entertainment unit, a fixed location data unit, a desktop computer, a monitor, a computer monitor, a television, a tuner, a music player, a digital music player, a video player, a digital video player, a digital video disc (DVD) player, or a combination thereof.

32. The apparatus of claim 25, wherein the doped region and the channel means are separated by an undoped portion of the means for inhibiting current leakage.

33. A method comprising:
fabricating a semiconductor device that includes:
a high mobility channel between a source region and a drain region, wherein the high mobility channel extends substantially a length of a gate; and
a doped region extending from the source region or the drain region toward the high mobility channel, wherein an undoped portion of a substrate separates the doped region and the high mobility channel.

34. The method of claim 33, wherein the semiconductor device is fabricated based on a data file, and wherein the data file has a GDSII format.

35. A method comprising:
manufacturing a circuit board configured to receive a packaged semiconductor device, wherein the packaged semiconductor device comprises:
a high mobility channel between a source region and a drain region, wherein the high mobility channel extends substantially a length of a gate; and
a doped region extending from the source region or the drain region toward the high mobility channel, wherein an undoped portion of a substrate separates the doped region and the high mobility channel.

36. The method of claim 35, wherein the circuit board is manufactured based on a data file, and wherein the data file comprises a GERBER format.

37. The method of claim 35, further comprising integrating the circuit board into a device comprising a mobile phone, a cellular phone, a portable computer, a radio, a satellite radio, a communication device, a portable music player, a portable digital video player, a navigation device, a personal digital assistant (PDA), a mobile location data unit, or a combination thereof.

38. The method of claim 35, further comprising integrating the circuit board into a device comprising a set top box, an entertainment unit, a fixed location data unit, a desktop computer, a monitor, a computer monitor, a television, a tuner, a music player, a digital music player, a video player, a digital video player, a digital video disc (DVD) player, or a combination thereof.

39. A semiconductor device comprising:
a high mobility channel positioned between a source region and a drain region;
a metal in contact with the source region or the drain region; and
a substrate including a doped region and an undoped region, the doped region in contact with the source region or the drain region, wherein the source region or the drain region is between the metal and a first portion of the doped region, and wherein the doped region and the high mobility channel are separated by the undoped region.

40. The semiconductor device of claim 39, wherein the doped region is physically isolated from the high mobility channel.

41. A semiconductor device comprising:
a high mobility channel positioned between a source region and a drain region, wherein the high mobility channel extends substantially a length of a gate;
a first doped region extending from the source region toward the high mobility channel, wherein the first doped region and the high mobility channel are separated by a first undoped portion of a substrate; and
a second doped region extending from the drain region toward the high mobility channel, wherein the second doped region and the high mobility channel are separated by a second undoped portion of the substrate.

42. The semiconductor device of claim 41, further comprising:
the gate, wherein the high mobility channel is coupled to the gate; and
a spacer coupled to the gate, wherein the spacer is in contact with the first doped region and the first undoped portion of the substrate.

43. The semiconductor device of claim 41, wherein the first doped region is in contact with the source region and the substrate, and wherein the first doped region is physically isolated from the high mobility channel.

44. An apparatus comprising:
channel means for supporting a high-mobility carrier path between a source region and a drain region when a semiconductor device is in an on state, wherein the channel means for supporting the high-mobility carrier path extends substantially a length of a gate of the semiconductor device; and
means for inhibiting current leakage between the channel means for supporting the high-mobility carrier path and a doped region associated with one of the source region or the drain region, wherein the means for inhibiting current leakage is positioned between the doped region and the channel means for supporting the high-mobility carrier path, and wherein a first portion of the doped region is positioned below the source region or the drain region.

45. The apparatus of claim 44, wherein the doped region and the channel means for supporting the high-mobility carrier path are separated by an undoped portion of the means for inhibiting current leakage.

* * * * *